(12) United States Patent
Tu et al.

(10) Patent No.: US 9,337,229 B2
(45) Date of Patent: May 10, 2016

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Chien Nan Tu, Kaohsiung (TW); Yu-Lung Yeh, Kaohsiung (TW); Ming-Hsien Wu, Tainan (TW); Li-Ming Sun, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/244,562

(22) Filed: Apr. 3, 2014

(65) Prior Publication Data

US 2015/0187827 A1  Jul. 2, 2015

Related U.S. Application Data

(62) Division of application No. 14/140,757, filed on Dec. 26, 2013, now abandoned.

(51) Int. Cl.
*H01L 27/146* (2006.01)

(52) U.S. Cl.
CPC ...... *H01L 27/1464* (2013.01); *H01L 27/14625* (2013.01); *H01L 27/14685* (2013.01)

(58) Field of Classification Search
CPC .................. H01L 27/1464; H01L 27/14685
USPC ........................................................... 438/71
See application file for complete search history.

(56) References Cited

U.S. PATENT DOCUMENTS

| 3,487,223 | A | 12/1969 | St John |
| 4,419,533 | A | 12/1983 | Czubatyj et al. |
| 5,164,324 | A | 11/1992 | Russell et al. |
| 6,080,683 | A | 6/2000 | Faur et al. |
| 7,057,256 | B2 | 6/2006 | Mazur |
| 7,456,452 | B2 | 11/2008 | Wells et al. |
| 7,741,664 | B2 * | 6/2010 | Choi et al. .................... 257/291 |
| 7,781,856 | B2 | 8/2010 | Mazur et al. |
| 2002/0117623 | A1 * | 8/2002 | Cole ......................... 250/338.1 |
| 2007/0167011 | A1 | 7/2007 | Hidaka |

(Continued)

OTHER PUBLICATIONS

L. Forbes, unpublished thesis work, University of Illinois, 1968-1969 ; c.f. for a historical review http://doc.utwente.nl/38679/1/t0000018.pdf.

(Continued)

*Primary Examiner* — Ha Tran T Nguyen
*Assistant Examiner* — Aaron Dehne
(74) *Attorney, Agent, or Firm* — Chun-Ming Shih

(57) ABSTRACT

A semiconductor device includes an epitaxial layer including a first surface and a silicon layer disposed on the first surface and including a second surface opposite to the first surface, wherein the silicon layer includes a plurality of pillars on the second surface, a portion of the plurality of pillars on a predetermined portion of the second surface are in substantially same dimension, each of the plurality of pillars on the predetermined portion of the second surface stands substantially orthogonal to the second surface, the plurality of pillars are configured for absorbing an electromagnetic radiation of a predetermined wavelength projected from the epitaxial layer and generating an electrical energy in response to the absorption of the electromagnetic radiation.

20 Claims, 21 Drawing Sheets

(56) References Cited

U.S. PATENT DOCUMENTS

| | | |
|---|---|---|
| 2010/0052088 A1 | 3/2010 | Carey et al. |
| 2012/0068289 A1* | 3/2012 | Alie et al. ............... 257/432 |
| 2015/0014803 A1* | 1/2015 | Haddad ................ 257/432 |

OTHER PUBLICATIONS

H. Jansen, M. de Boer, R. Legtenberg, M. Elwenspoek, "The black silicon method: a universal method for determining the parameter setting of a fluorine-based reactive ion etcher in deep silicon trench etching with profile control," Journal of Micromechanics and Microengineering, vol. 5, No. 2, p. 115. doi:10.1088/0960-1317/5/2/015.

Z. Huang, J.E. Carey, M. Liu, X. Guo, J. C. Campbell and E. Mazur, "Microstructured silicon photodetector," Appl. Phys. Letters, vol. 89, 033506, 2006.

S. M. Sze, "Physics of Semiconductor Devices." Wiley Interscience, New York, 2nd Ed., 1981, p. 746.

C-T. Sah, L. Forbes and W.W. Chan, "A New Model of Negative Photocurrent," Science Bulletin of National Chiao-Tung University, vol. V, No. 2, pp. 1-10, 1972.

S. A. Boden and D. M. Bagnall, "Nanostructured Biomimetic Motheye Arrays in Silicon by Nanoimprint Lithography," Proc. of SPIE, vol. 7401, 74010J, 2009. doi: 10.1117/12.826201.

The Times, London, UK, May 31, 2010, "Bank Note Nanotechnology based on Butterfly Wings could beat Forgers.".

Von D. A. G. Bruggemann, "Berechnung Verschiedcner Physikalischer Konstanten von Heterogenen Substanzen," Annalen der Physik, 5. folge, band 24, pp. 636-664, Sep. 1935.

R. A. Arndt, J. F. Allison, J. G. Haynos, and A. Meulenberg, Jr., "Optical properties of the COMSAT non-reflective cell," 11th IEEE Photovoltaic Spec. Conf., pp. 40-43, 1975.

L. Forbes, "Texturing, reflectivity, diffuse scattering and light trapping in silicon solar cells," Solar Energy, vol. 86, No. 1, pp. 319-325, Jan. 2012, doi: 10.1016/j.solener.2011.10.003.

E. Yablonovich, and G.D. Cody, "Intensity Enhancement in Textured Optical Sheets for Solar Cells," IEEE Transactions on Electron Devices, vol. ED-29, pp. 300-305, 1982.

P. Campbell and M. A. Green, "High performance light trapping textures for monocrystalline silicon solar cells," doi: 10.1016/S0927-0248(00)00115-X.

S. D. Russell, A. D. Ramirez, and E. P. Kelley, "Nanosecond Excimer Laser Processing for Novel Microelectronic Fabrication," ie SSC Pacific Technical Reports, vol. 4 Navigation and Applied Sciences, pp. 228-233, 2003. http://www.spawar.navy.mil/sti/publications/pubs/td/3155/5a_S4papers/NanoXLaser.pdf.

K. Yamamoto, A. Sakamoto, T. Nagano, and K. Fukumitsu, "NIR sensitivity enhancement by laser treatment for Si detectors," Nuclear Instr. and Meth. Phys., vol. A624, pp. 520-523, 2010.

Z. Shi, S. Wenham, J. Ji, S. Partlin, and A. Sugianto, "Mass Production of the Innovative Pluto Solar Cell Technology," SunTech, White paper, 2011. http://am.suntech-power.com/.

H.-C. Yuan, V. E. Yost, M. R. Page, P. Stradins, D. L. Meier and H. M. Branz, "Efficient black silicon solar cell with a density-graded nanoporous surface: Optical properties, performance limitations, and design rules," Appl. Phys. Lett., vol. 95, 123501, 2009. doi:10.1063/1.3231438.

C. Vineis, M. Levy-Finklshtein, J. Carey, G. Knight, E. Wefringhaus and R. Harney, "Ultrafast Laser Texturing for Enhanced Solar Cell Performance and Lower Cost," http://www.sionyx.com/pdf/solarcellperformancewhitepaper.pdf.

T. Geipel, S. Pingel, J. Dittrich, Y. Zemen, G. Kropke, M. Wittner, and J. Berghold, "Comparison of acidic and alkaline textured multicrystalline solar cells in a solar panel production," http://www.solon.com/export/sites/default/solonse.com/_downloads/global/article-pid/Geipel_et_al_texturization.pdf.

http://www.gpo.gov/fdsys/pkg/FR-2012-07-17/pdf/2012-16710.pdf.

* cited by examiner

SEMICONDUCTOR DEVICE AND MANUFACTURING METHOD THEREOF

BACKGROUND

Electronic equipment using semiconductor devices are essential for many modern applications. Semiconductor image sensors are commonly involved in electronic equipment used for sensing radiation, such as lights. Complementary metal-oxide-semiconductor (CMOS) image sensors (CIS) are widely used in various applications, such as digital camera and mobile phone cameras. The CIS includes an array of pixels located on a substrate. Each pixel includes a photodetector, such as a photodiode or transistor, which absorbs the radiation projected towards the substrate and converts the radiation into an electrical signal.

A back side illuminated (BSI) image sensor device is one type of image sensor device. The BSI image sensor device includes a substrate and a photodetector disposed on a backside of the substrate. Radiation falls directly on the photodetector, rather than passing through a circuitry of the substrate to the photodetector. The radiation sensed by the BSI image sensor device is not disrupted by the substrate.

In the BSI image sensor device, an anti-reflective material is used for absorbing the radiation projected on the device. The anti-reflective material can reduce or prevent a reflection of radiation from its surface and thus an absorption of the radiation by the anti-reflective material can be attained. Further, the anti-reflective material can selectively absorb the radiation in a desired wavelength range.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
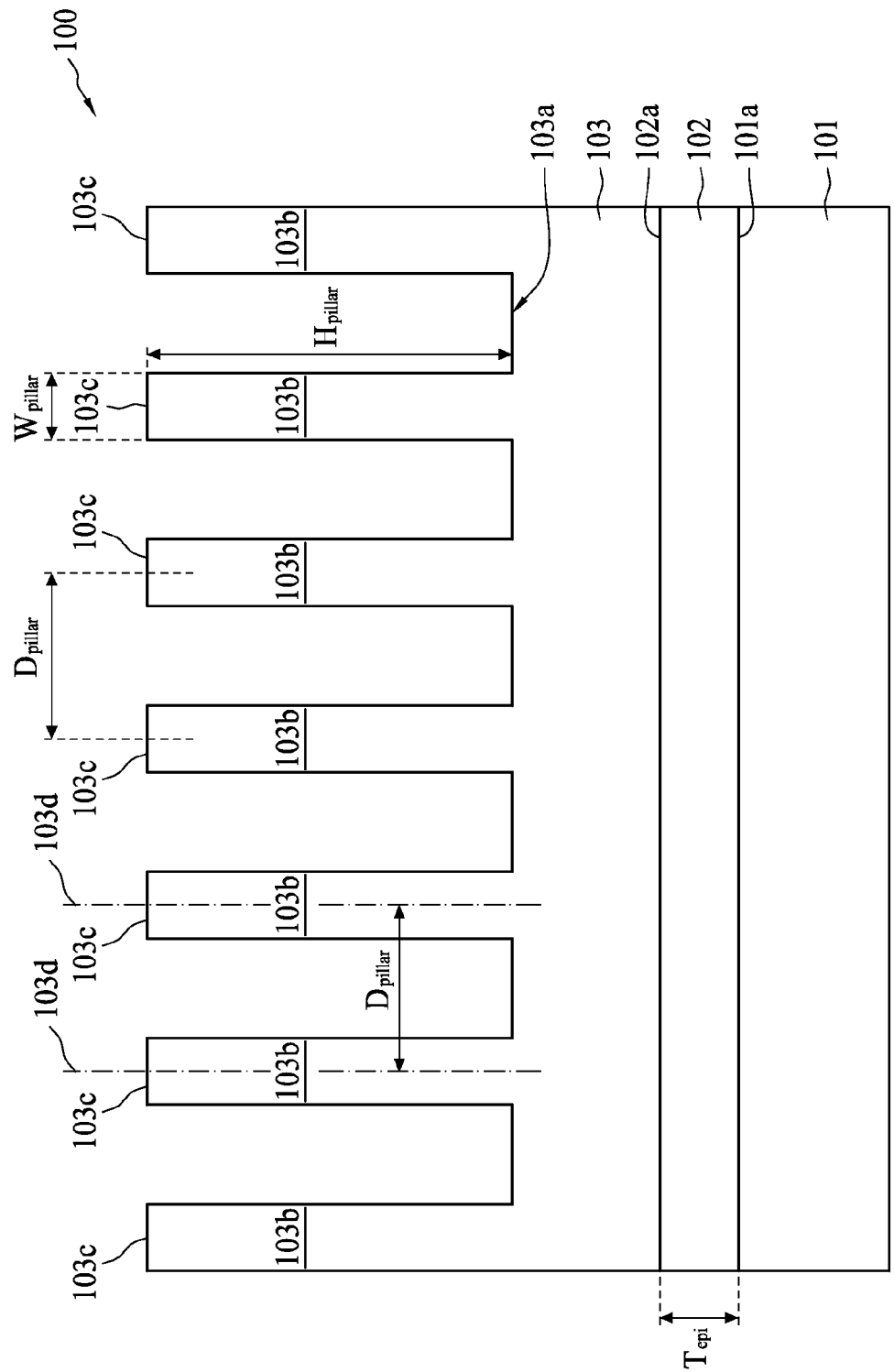
FIG. 1 is a schematic view of a semiconductor device in accordance with some embodiments of the present disclosure.

A semiconductor device is manufactured by a number of operations. During the manufacturing, a surface of a silicon layer is fabricated for absorbing radiation projected into the semiconductor device. The surface of the silicon layer is roughened, so that the silicon layer becomes high absorption silicon for radiation absorption.

The high absorption silicon can be fabricated by various operations such as laser treatment. The surface of the silicon layer is treated under a noble gas atmosphere such as Argon, such that some portions of the silicon layer are removed from its surface after the laser treatment, thus some pillars standing on the surface of the silicon layer are formed and the silicon layer becomes the high absorption silicon. Those pillars facilitates the absorption of radiation projected on the silicon layer, as the pillars can refract the radiation within the silicon layer and thus the radiation cannot be reflected away from the pillars or the silicon layer.

However, the pillars on the silicon layer formed by the laser treatment have a problem of non-uniformity in dimension and shape. The laser treatment has a poor selectivity of removal of the silicon layer. As formation of each pillar cannot be accurately controlled as desired, the pillars are sized and shaped different from each other. Uniform pillars cannot be fabricated on the surface of the silicon layer by the laser treatment.

The non-uniformity of the pillars on the surface of the silicon layer would cause undesired reflection of some radiation from the surface out of the semiconductor device, and thus would lead to an incomplete absorption of radiation by the silicon layer. Some radiation are reflected out of the semiconductor device and cannot be absorbed by the silicon layer. The reflection of radiation is undesirable and would affect a quality of sensing the radiation by the semiconductor device.

Furthermore, the laser treatment is not suitable for high volume production of the high absorption silicon. A throughput of the high absorption silicon by the laser treatment is low, and thus a batch production of the high absorption silicon cannot be produced. However, a demand on the semiconductor device including the high absorption silicon is increasing, as such there is a continuous need to improve the manufacturing operations in order to increase the throughput of the high absorption silicon and attain a high volume production of the high absorption silicon.

In the present disclosure, a semiconductor device with an improved configuration and operations are disclosed. The semiconductor device includes a silicon layer. The silicon layer is modified to become high absorption silicon by forming several pillars on a surface of the silicon layer. The silicon layer is treated through photolithography operations and then the pillars in uniform dimension and shape are formed by plasma etching operations. Upon the photolithography operations, a photoresist in a predetermined pattern is developed on the silicon layer. Some of the silicon layer are then etched by plasma ions according to the predetermined pattern to form the uniform pillars on the silicon layer upon the plasma etching operations. As the photolithography operations together with the plasma etching operations can provide a high selectivity of etching of the silicon layer, the pillars in uniform dimension and shape can be formed. Therefore, the performance of electromagnetic radiation absorption by the high absorption silicon is improved.

The manufacturing and use of the embodiments of the present disclosure are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

FIG. 1 is a diagram of a semiconductor device 100 in accordance with various embodiments of the present disclosure. The semiconductor device 100 includes a first substrate 101. In some embodiments, the first substrate 101 includes silicon, ceramic, copper or etc. In some embodiments, the first substrate 101 includes group III, group IV, and/or group V elements, such as silicon, germanium, gallium, arsenic, and combinations thereof. In some embodiments, the first substrate 101 is produced from crystal form of silicon through numbers of operations such as fabrication, etching or photolithography, etc.

In some embodiments, the first substrate 101 is a silicon wafer or a glass wafer. In some embodiments, the first substrate 101 is in a form of silicon-on-insulator (SOI). The SOI substrate includes a layer of a semiconductor material (e.g., silicon, germanium and/or the like) disposed over an insulator layer (e.g., buried oxide and/or the like), which is formed in a silicon substrate. In some embodiments, the first substrate 101 is in a form of multi-layered substrates, gradient substrates, hybrid orientation substrates, any combinations thereof and/or the like.

In some embodiments, the semiconductor device 100 includes an epitaxial layer 102. In some embodiments, the epitaxial layer 102 is disposed on a top surface 101a of the first substrate 101. In some embodiments, the epitaxial layer 102 is a thin crystalline layer of silicon. The epitaxial layer 102 is used for disposing several layers of silicon on the first substrate 101. In some embodiments, the epitaxial layer has a thickness $T_{epi}$ of about 0.5 um to about 20 um.

In some embodiments, the semiconductor device 100 includes a semiconductor layer on a first surface 102a of the epitaxial layer 102. The first surface 102a is opposite to the top surface 101a. In some embodiments, the semiconductor layer is a silicon layer 103. In some embodiments, the silicon layer 103 includes several pillars 103b on a second surface 103a of the silicon layer 103 opposite to the first surface 102a. In some embodiments, the pillars 103b are extended upright from the second surface 103a.

In some embodiments, the pillars 103b are consistently spaced from each other in a distance $D_{pillar}$. In some embodiments, the pillars 103b are disposed on the second surface 103a in a high density. In some embodiments, the distance $D_{pillar}$ is about 250 nm. In some embodiments, the distance $D_{pillar}$ is about 50 nm to about 1000 nm.

In some embodiments, a portion of the pillars 103b on a predetermined portion of the second surface 103a of the silicon layer 103 are in substantially same dimension. In some embodiments, the pillars 103b within the predetermined portion of the second surface 103a are in same shape, size, width, height, orientation or etc.

In some embodiments, each of the pillars 103b on the predetermined portion of the second surface 103a stands substantially orthogonal to the second surface 103a. In some embodiments, each of the pillars 103b has a central axis 103d, and the central axis 103d is orthogonal to the second surface 103a. In some embodiments, the pillars 103b are oriented substantially parallel to each other.

In some embodiments, each of the pillars 103b on the predetermined portion of the second surface 103a is in a cylindrical shape. In some embodiments, an interface between the pillar 103b and the second surface 103a is in various shapes such as circular shape, quadrilateral shape, polygonal shape or etc. In some embodiments, each of the interfaces between the pillars 103b and the second surface 103a are substantially consistent in shape. In some embodiments, top surfaces 103c of the pillars 103 are at substantially same level as each other.

In some embodiments, each of the pillars 103b on the predetermined portion of the second surface 103a is in a high aspect ratio between a height $H_{pillar}$ and a width $W_{pillar}$. In some embodiments, the pillar 103b has the aspect ratio of about 1:1 to about 1:100. In some embodiments, the pillar 103b has the height $H_{pillar}$ of about 0.5 um to about 100 um. In some embodiments, the width $W_{pillar}$ is a diameter of the interface between the pillar 103b and the second surface 103a. In some embodiments, the pillar 103b has the width $W_{pillar}$ of about 10 nm to about 100 nm. In some embodiments, each of the pillars 103b on the predetermined portion of the second surface 103a has substantially same height $H_{pillar}$ and $W_{pillar}$.

In some embodiments, the pillars 103b are configured for absorbing an electromagnetic radiation of a predetermined wavelength and generating an electrical energy in response to the absorption of the electromagnetic radiation. In some embodiments, the electromagnetic radiation has the predetermined wavelength of about 200 nm to about 3000 nm. In some embodiments, the predetermined wavelength of the electromagnetic radiation is about 200 nm to 400 nm. In some embodiments, the predetermined wavelength of the electromagnetic radiation is about 400 nm to 1200 nm. In some embodiments, the predetermined wavelength of the electromagnetic radiation is about 1200 nm to 2000 nm. In some embodiments, the predetermined wavelength of the electromagnetic radiation is about 2000 nm to 3000 nm. In some embodiments, the pillars 103b absorbs a visible light or an infrared (IR).

In some embodiments, the visible light is projected on the silicon layer 103. The visible light is then absorbed by the pillars 103b and the electrical energy in accordance with an intensity or brightness of the visible light is generated. In some embodiments, the electrical energy transmits to a circuitry of a second substrate adjacent to the silicon layer 103, so that the visible light is detected and processed for subsequent operations such as image capturing, reformation of image or etc.

In some embodiments, formation of the pillars 103b on the second surface 103a of the silicon layer 103 improves the absorption of the electromagnetic radiation projected on the silicon layer 103, as the pillars 103b increase a surface area of the silicon layer 103 for receiving the electromagnetic radiation. Thus, a wider range of wavelength of the electromagnetic radiation is absorbed by the silicon layer 103. As such, the silicon layer 103 has an improved sensitivity on the electromagnetic radiation. In some embodiments, the silicon layer 103 with the pillars 103b is a high absorption silicon.

Figure 2:
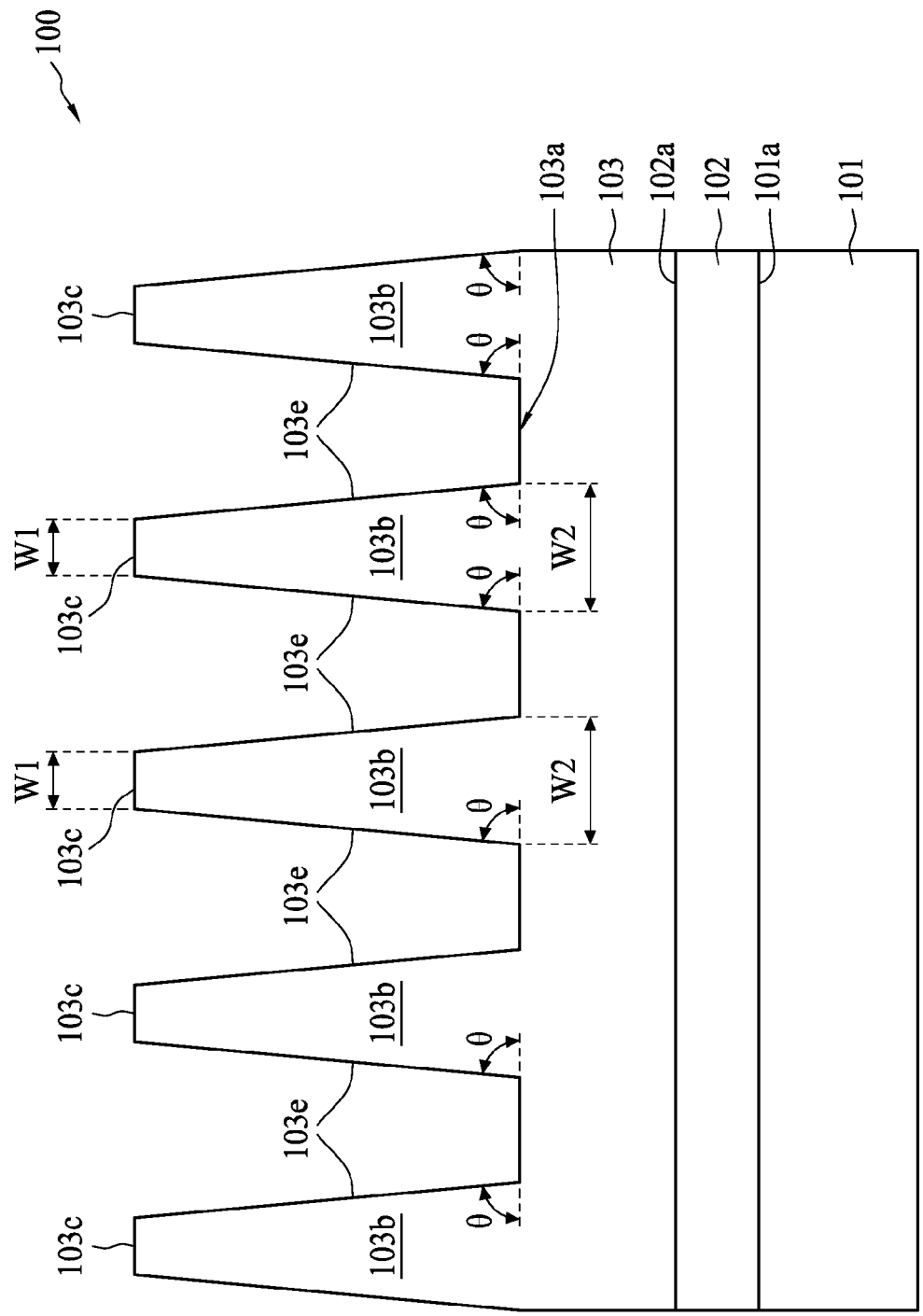
FIG. 2 is a schematic view of a semiconductor device with needle shaped pillars in accordance with some embodiments of the present disclosure.

FIG. 2 is a diagram of a semiconductor device 100 in accordance with various embodiments of the present disclosure. The semiconductor device 100 includes a first substrate 101, an epitaxial layer 102 and a silicon layer 103, similar to the semiconductor device 100 of FIG. 1. In some embodiments, the silicon layer 103 has several pillars 103b disposed on a second surface 103a. In some embodiments, each of the pillars 103b are in a needle shape as in FIG. 2, that an end of the pillar 103b is tapered towards another end. In some embodiments, a top surface 103c of the pillar 10b is in a dome shape convexing from the silicon layer 103.

In some embodiments, the pillar 103b has a width W1 of a first end and a width W2 of a second end. In some embodiments, the width W1 is different from the width W2. In some embodiments, the width W1 is smaller than the width W2. In some embodiments, the width W1 is about 10 nm to about 150 nm, and the width W2 is about 50 nm to about 1000 nm. In some embodiments, there is an angle θ between an outer surface 103e of the pillar 103b and the second surface 103a. The angle θ is about 30 degrees to about 85 degrees.

Figure 3:
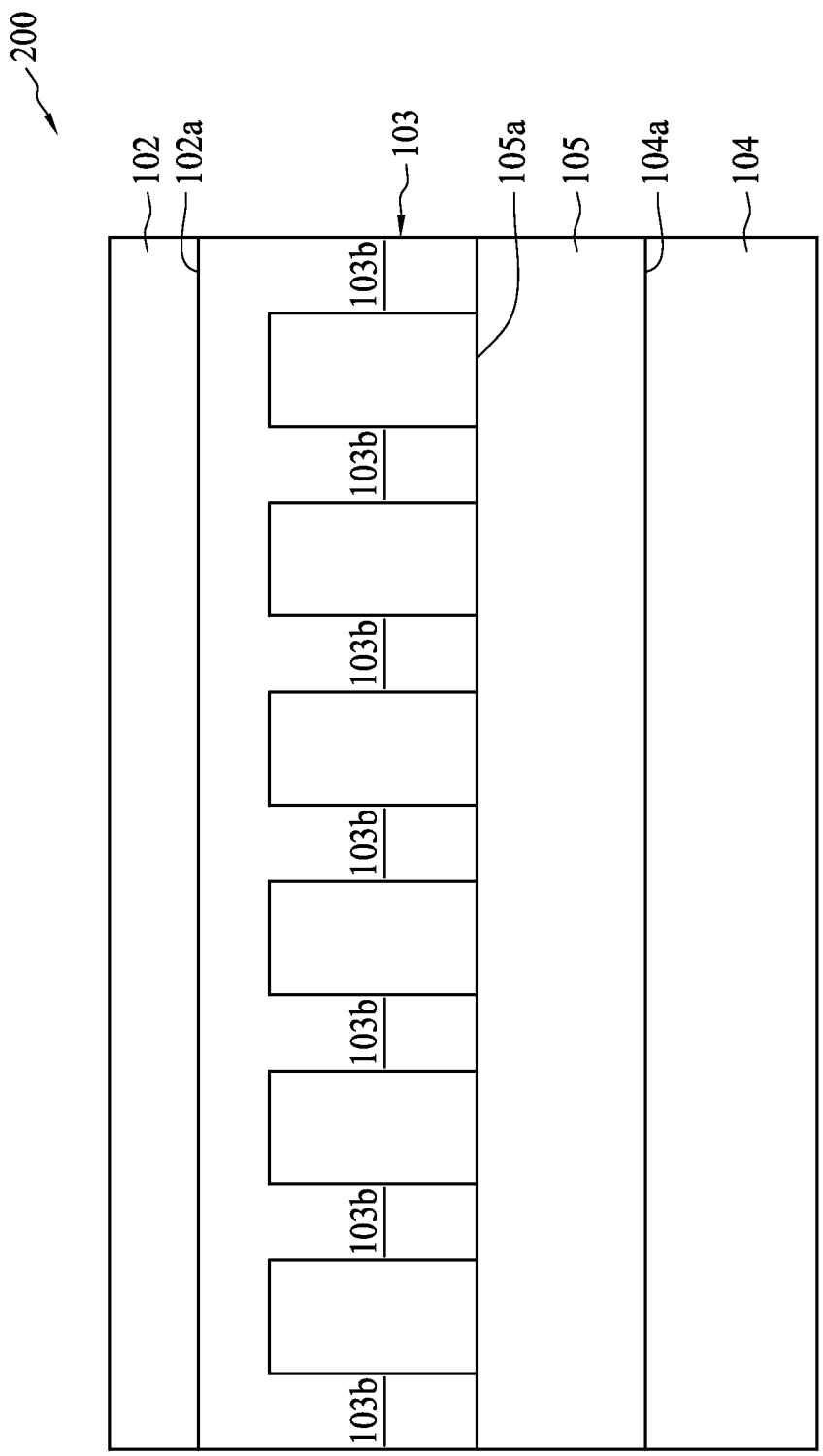
FIG. 3 is a schematic view of a semiconductor device bonded with a second substrate in accordance with some embodiments of the present disclosure.

FIG. 3 is a diagram of a semiconductor device 200 in accordance with various embodiments of the present disclosure. The semiconductor device 200 includes an epitaxial layer 102 and a silicon layer 103. In some embodiments, the epitaxial layer 102 and the silicon layer 103 are formed from the semiconductor device 100 of FIG. 1. The first substrate 101 of the semiconductor device 100 of FIG. 1 is removed during a backside thinning operation or other suitable grinding operations. A backside of the first substrate 101 opposite to the top surface 101a is ground until the epitaxial layer 102 is exposed. In some embodiments, a portion of the epitaxial layer 102 is remained. In some embodiments, a p-type photo active region and an n-type photo active region are formed in the remaining epitaxial layer 102.

In some embodiments, the epitaxial layer 102 and the silicon layer 103 of the semiconductor device 100 in FIG. 1 are flipped over and disposed over a second substrate 104 to be a semiconductor device 200 as in FIG. 3. The epitaxial layer 102 is on a top of the semiconductor device 200, while the second substrate 104 is at a bottom of the semiconductor device 200. Thus, the silicon layer 103 including several pillars 103b is disposed between the epitaxial layer 102 and the second substrate 104.

In some embodiments, the second substrate 104 of the semiconductor device 200 includes silicon, ceramic, copper or etc. In some embodiments, the second substrate 104 is a silicon wafer. In some embodiments, the second substrate 104 is fabricated to include a variety of electrical circuits suitable for a particular application. In some embodiments, the electrical circuits includes various n-type metal-oxide semiconductor (NMOS) and/or p-type metal-oxide semiconductor (PMOS) devices such as transistors, capacitors, resistors, diodes, photo-diodes, fuses and/or the like. The electrical circuits are interconnected to perform one or more functions such as memory structures, processing structures, sensors, amplifiers, power distribution, input/output circuitry and/or the like.

In some embodiments, the second substrate 104 includes a transistor which generates an electrical signal in accordance with an intensity or brightness of an electromagnetic radiation projected on the photo active regions of the epitaxial layer 102 and absorbed by the silicon layer 103, so that the electromagnetic radiation is detected and processed for subsequent operation. In some embodiments, the second substrate 104 includes several interconnection layers and several conductive traces embedded in the interconnection layers. The conductive traces of the second substrate 104 transmit the electrical signal to the electrical circuits in the second substrate 104 or circuits external to the second substrate 104.

In some embodiments, an oxide layer 105 is disposed between the second substrate 104 and the silicon layer 103. The oxide layer 105 is formed on the second substrate 104 prior to disposition of the epitaxial layer 102 and the silicon layer 103. In some embodiments, the oxide layer 105 is a silicon oxide layer. In some embodiments, the pillars 103b of the silicon layer 103 are disposed on a top surface 105a of the oxide layer 105.

In some embodiments, the electromagnetic radiation is projected from the epitaxial layer 102 to the second substrate 104. The electromagnetic radiation passes through the epitaxial layer 102, and the pillars 103b of the silicon layer 103 absorbs the electromagnetic radiation. The absorption of the electromagnetic radiation generates an electrical energy, and an electrical signal related to the electrical energy is transmitted to the circuitry in the second substrate 104.

In the present disclosure, a method of manufacturing a semiconductor device is also disclosed. In some embodiments, a semiconductor device is formed by a method 300. The method 300 includes a number of operations and the description and illustration are not deemed as a limitation as the sequence of the operations.

Figure 4:
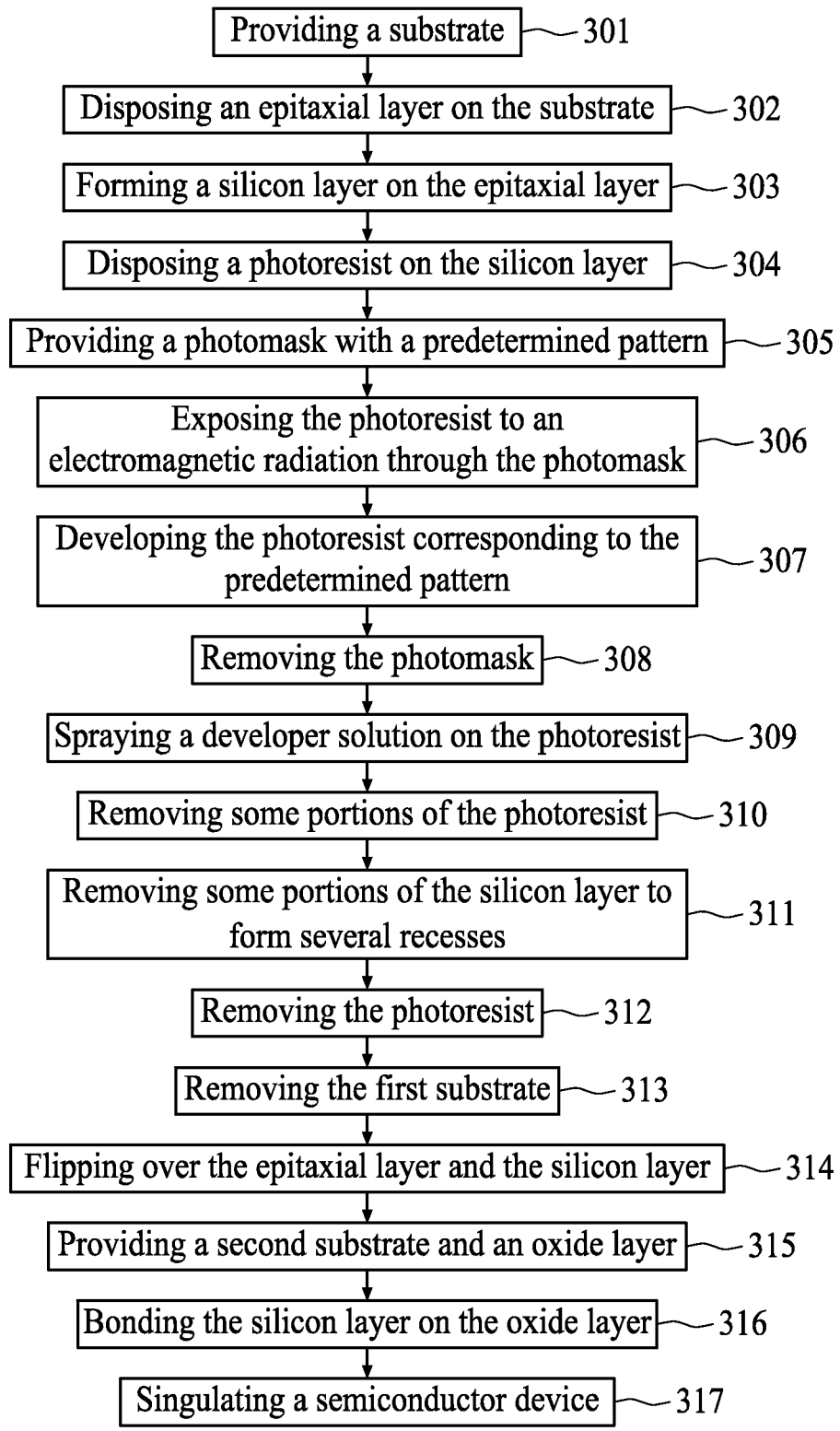
FIG. 4 is a flow diagram of a method of manufacturing a semiconductor device in accordance with some embodiments of the present disclosure.

FIG. 4 is a diagram of a method 300 of manufacturing a semiconductor device in accordance with various embodiments of the present disclosure. The method 300 includes a number of operations (301, 302, 303, 304, 305, 306, 307, 308, 309, 310, 311, 312, 313, 314, 315, 316 and 317).

Figure 4A:
FIG. 4A is a schematic view of a first substrate in accordance with some embodiments of the present disclosure.

In operation 301, a first substrate 101 is provided as in FIG. 4A. In some embodiments, the first substrate 101 is formed by a semiconductor material such as silicon. n some embodiments, the first substrate 101 is produced from crystal form of silicon through numbers of operations such as fabrication, etching or photolithography, etc. In some embodiments, the first substrate 101 has similar configuration as the first substrate 101 in FIG. 1.

Figure 4B:
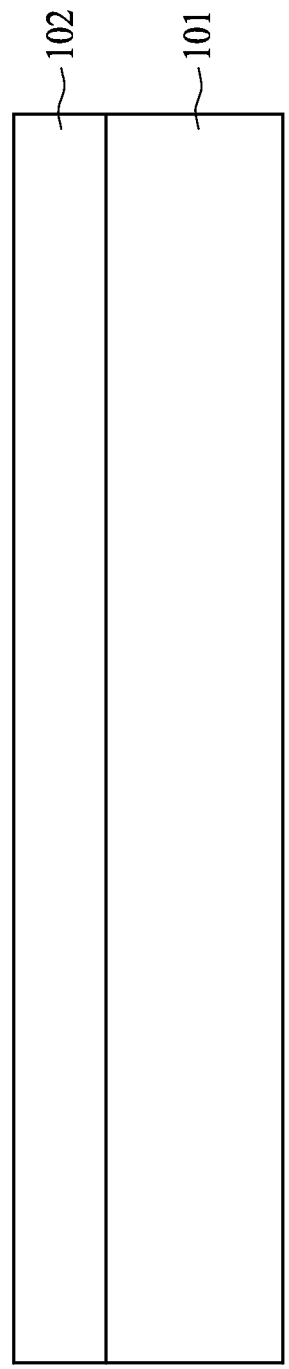
FIG. 4B is a schematic view of an epitaxial layer disposed on a first substrate in accordance with some embodiments of the present disclosure.

In operation 302, an epitaxial layer 102 is disposed on the first substrate 101 as in FIG. 4B. In some embodiments, the epitaxial layer 102 is a thin crystalline layer of silicon. The epitaxial layer 102 is used for disposing several layers of silicon on the first substrate 101. In some embodiments, the epitaxial layer 102 is formed by an epitaxy operation, that a crystal or a crystalline film of silicon in a particular orientation is grown on the first substrate 101. In some embodiments, the epitaxial layer 102 is manufactured by a chemical vapor deposition. In some embodiments, the epitaxial layer 102 has similar configuration as the epitaxial layer 102 in FIG. 1.

Figure 4C:
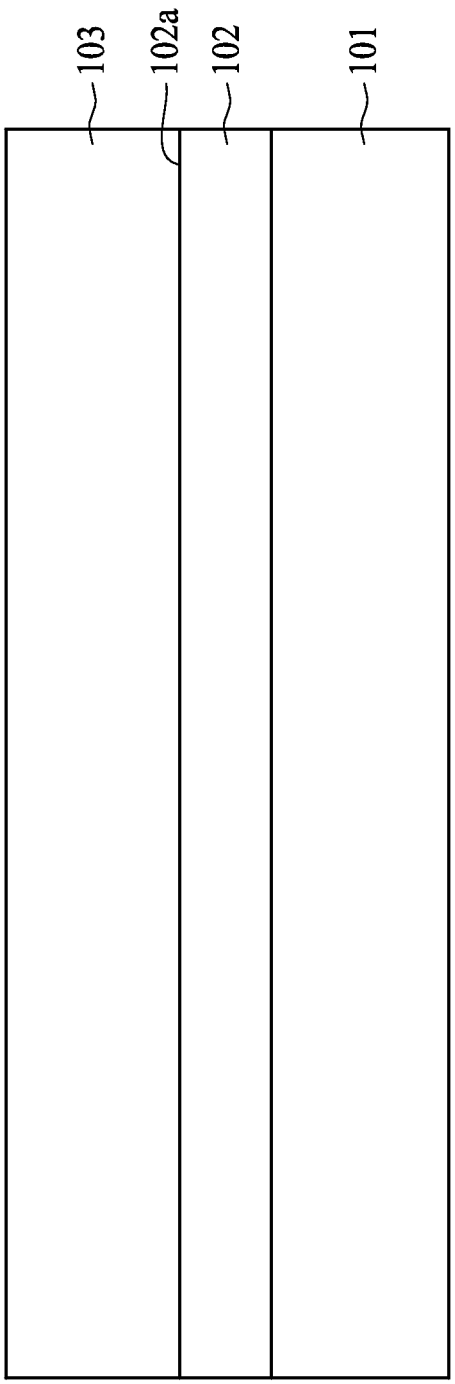
FIG. 4C is a schematic view of a silicon layer on an epitaxial layer in accordance with some embodiments of the present disclosure.

In operation 303, a silicon layer 103 is formed on the epitaxial layer 102 as in FIG. 4C. In some embodiments, the silicon layer 103 is disposed on a first surface 102a of the epitaxial layer 102. In some embodiments, the silicon layer 103 has similar configuration as the silicon layer 103 in FIG. 1.

Figure 4D:
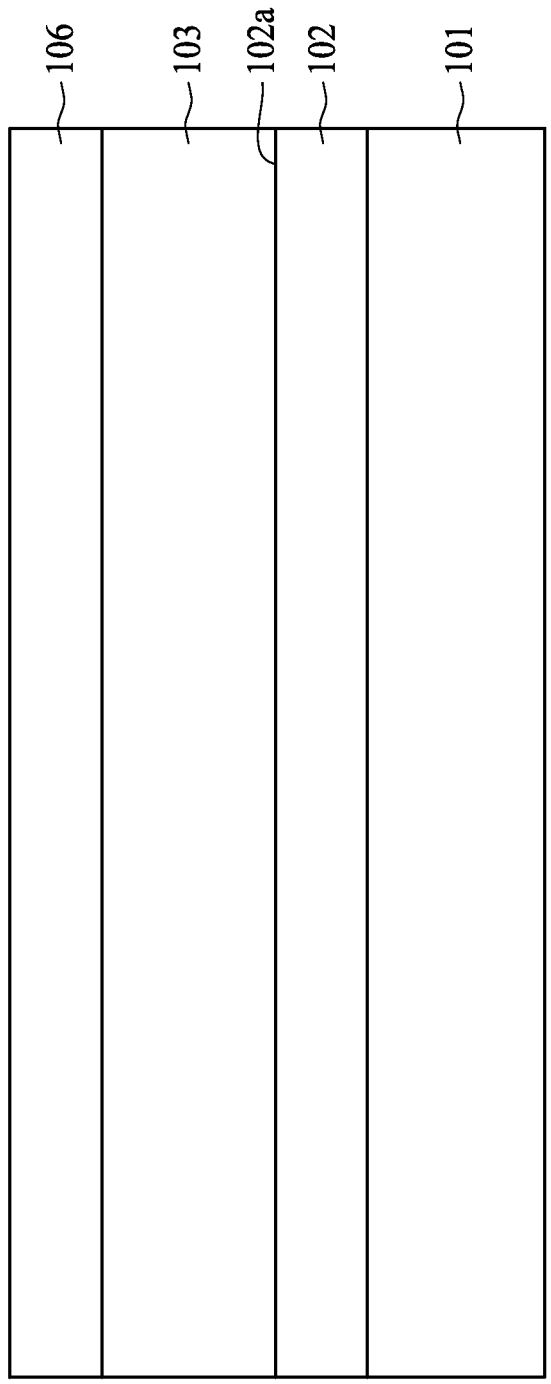
FIG. 4D is a schematic view of a photoresist on a silicon layer in accordance with some embodiments of the present disclosure.

In operation 304, a photoresist 106 is disposed on the silicon layer 103 as in FIG. 4D. In some embodiments, the photoresist 106 is temporarily coated on the silicon layer 103. In some embodiments, the photoresist 106 is a light sensitive material with chemical properties depending on an exposure of light. In some embodiments, the photoresist 106 is sensitive to an electromagnetic radiation such as an ultra violet (UV) light, that the chemical properties of the photoresist 106 is changed upon exposure to the UV light. In some embodiments, the photoresist 106 is evenly disposed on the silicon layer 103 by spin coating. In some embodiments, the photoresist 106 has a thickness of about 0.5 um to about 1.5 um.

In some embodiments, the photoresist 106 is a positive photoresist. The positive photoresist exposed to the UV light is dissolvable by a developer solution, while the positive photoresist unexposed to the UV light is not dissolvable by the developer solution.

In some embodiments, the photoresist 106 is a negative photoresist. The negative photoresist exposed to the UV light is not dissolvable by a developer solution, while the negative photoresist unexposed to the UV light is dissolvable by the developer solution.

Figure 4E:
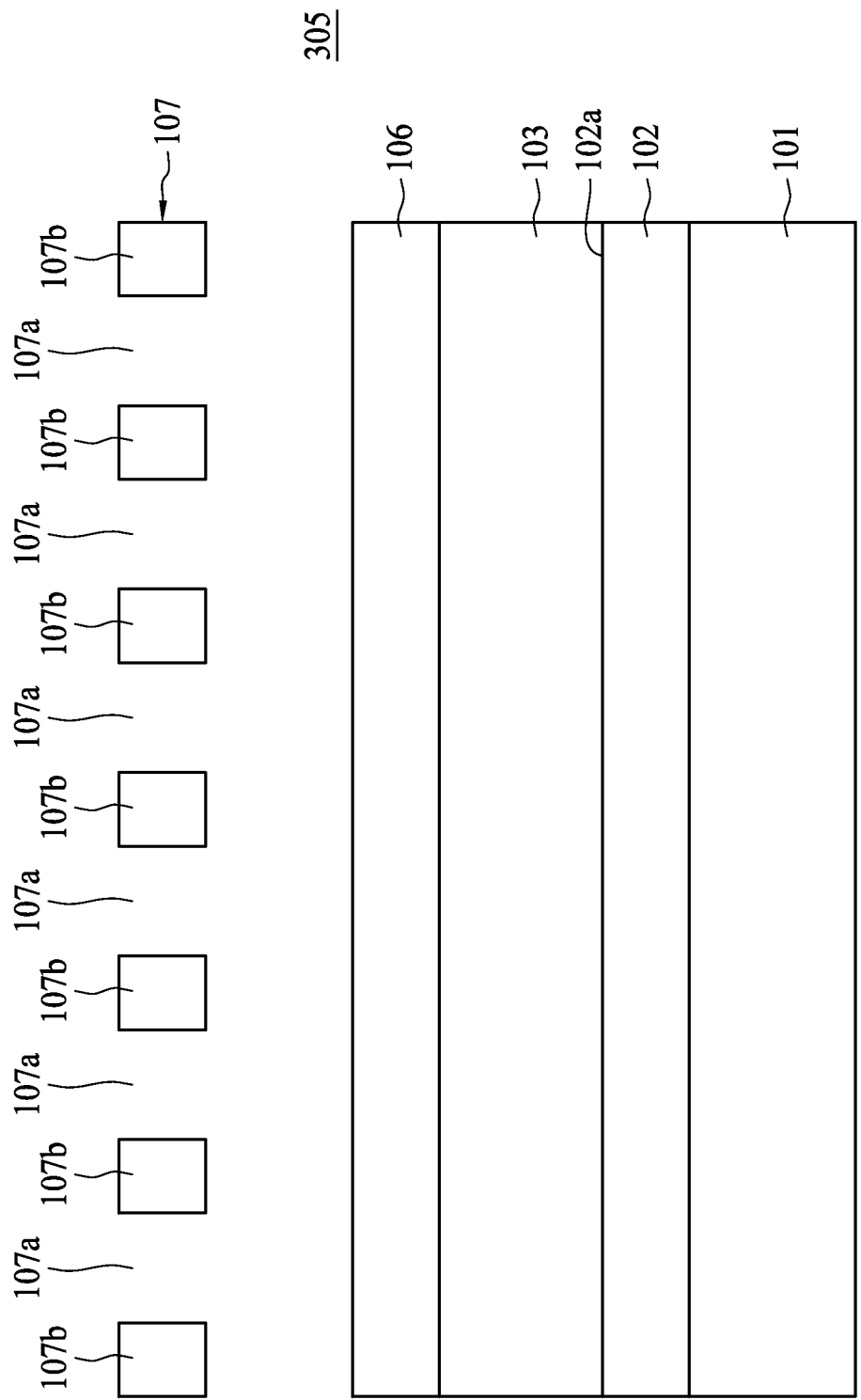
FIG. 4E is a schematic view of a photomask with a predetermined pattern disposed above a photoresist in accordance with some embodiments of the present disclosure.

In operation 305, a photomask 107 with a predetermined pattern is provided as in FIG. 4E. In some embodiments, the photomask 107 is disposed above the photoresist 106. In some embodiments, the photomask 107 includes silica, glass or etc.

In some embodiments, the photomask 107 has the predetermined pattern corresponding to positions of recesses to be formed on the silicon layer 103. In some embodiments, the predetermined pattern includes several light passing portions 107a and several light blocking portions 107b. In some embodiments, the light passing portion 107a allows an electromagnetic radiation such as UV light to pass through, while the light blocking portion 107b does not allow the electromagnetic radiation to pass through. In some embodiments, the light passing portions 107a are adjacent to the light blocking portions 107b. The light passing portions 107a and the light blocking portions 107b are intervally disposed.

Figure 4F:
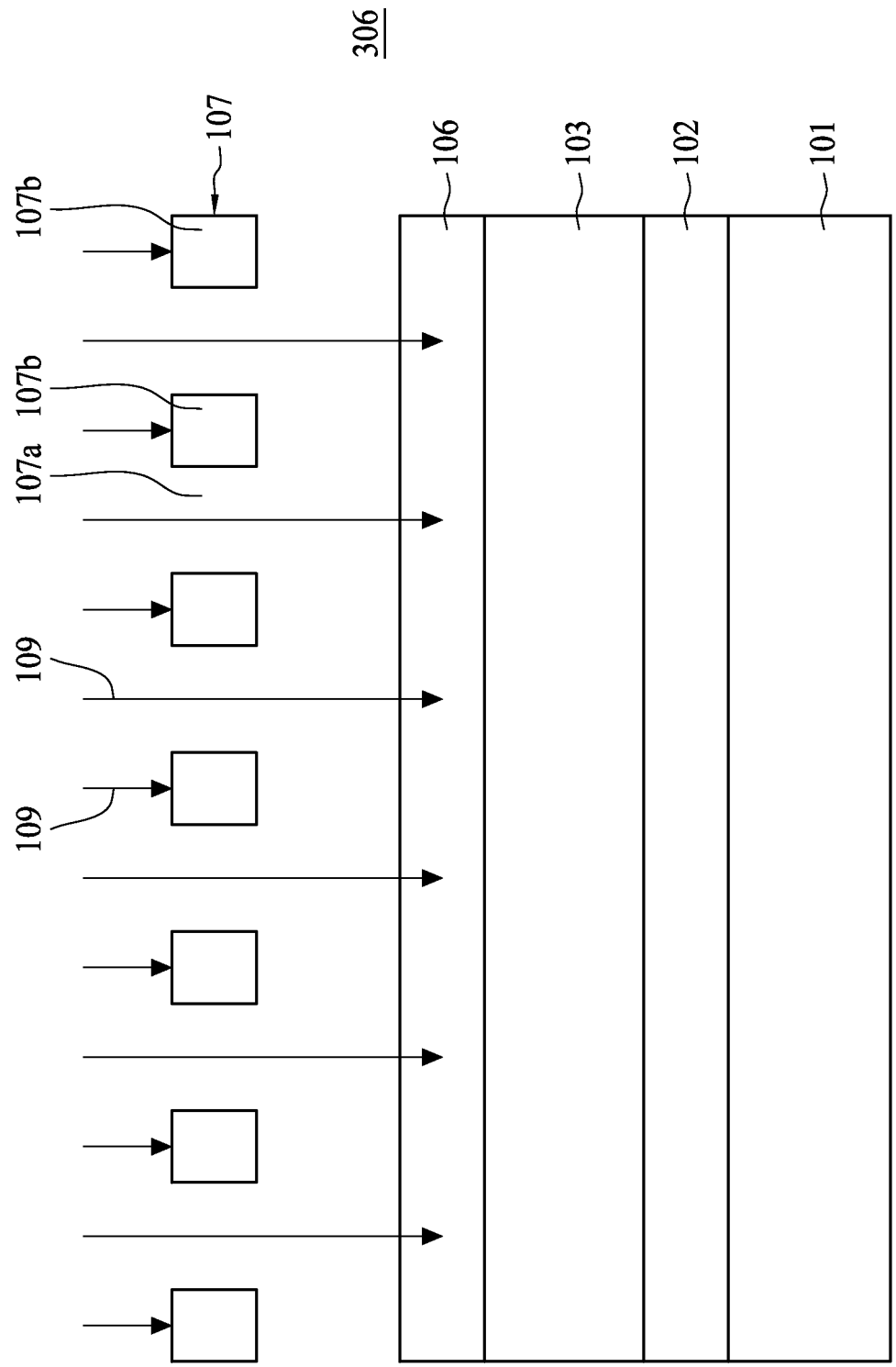
FIG. 4F is a schematic view of a photoresist exposing to an electromagnetic radiation through a photomask in accordance with some embodiments of the present disclosure.

In operation 306, an electromagnetic radiation 109 is projected on the photoresist 106 through the photomask 107 as in FIG. 4F. In some embodiments, the electromagnetic radiation is the UV light. In some embodiments, the UV light passes through the light passing portions 107a of the photomask 107, while the UV light is blocked by the light blocking portions 107b of the photomask 107. Thus, the photoresist 106 receives the UV light corresponding to the predetermined pattern of the photomask 107. The photoresist 106 is exposed to the UV light in substantially same as the predetermined pattern of the photomask 107.

Figure 4G:
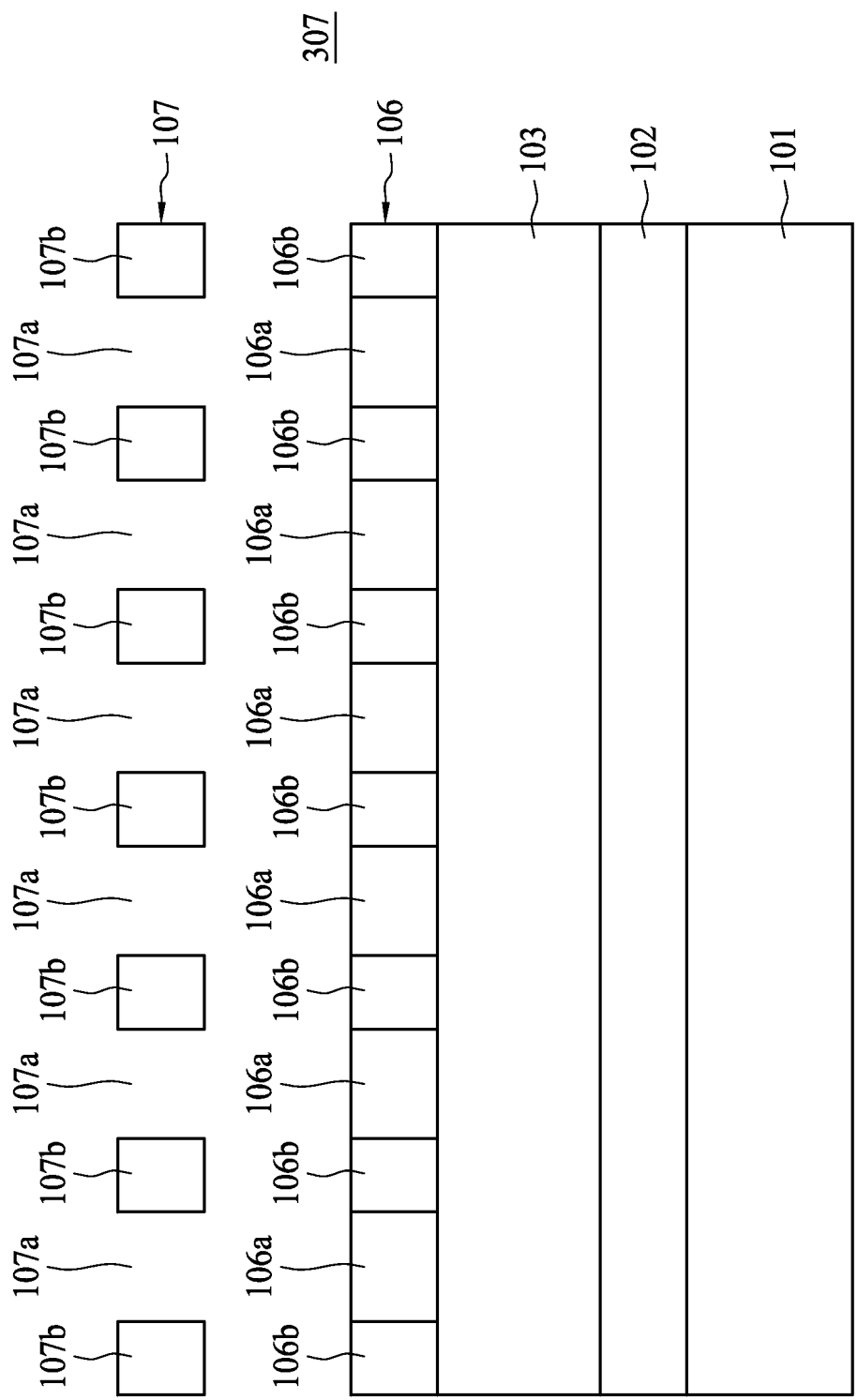
FIG. 4G is a schematic view of a photoresist with exposed portions and unexposed portions in accordance with some embodiments of the present disclosure.

In operation 307, the photoresist 106 including several exposed portions 106a and several unexposed portions 106b is developed after projection of the UV light on the photoresist 106 through the photomask 107 as in FIG. 4G. In some embodiments, the exposed portions 106a and the unexposed portions 106b are developed corresponding to the predetermined pattern of the photomask 107. In some embodiments, the exposed portions 106a of the photoresist 106 are aligned with the light passing portions 107a of the photomask 107. In some embodiments, the unexposed portions 106b of the photoresist 106 are aligned with the light blocking portions 107b of the photomask 107.

In some embodiments, if the photoresist 106 is the positive photoresist, the exposed portions 106a is dissolvable by a developer solution and the unexposed portions 106b is not dissolvable by the developer solution. In some embodiments, if the photoresist 106 is the negative photoresist, the exposed portions 106a is not dissolvable by a developer solution and the unexposed portions 106b is dissolvable by the developer solution.

Figure 4H:
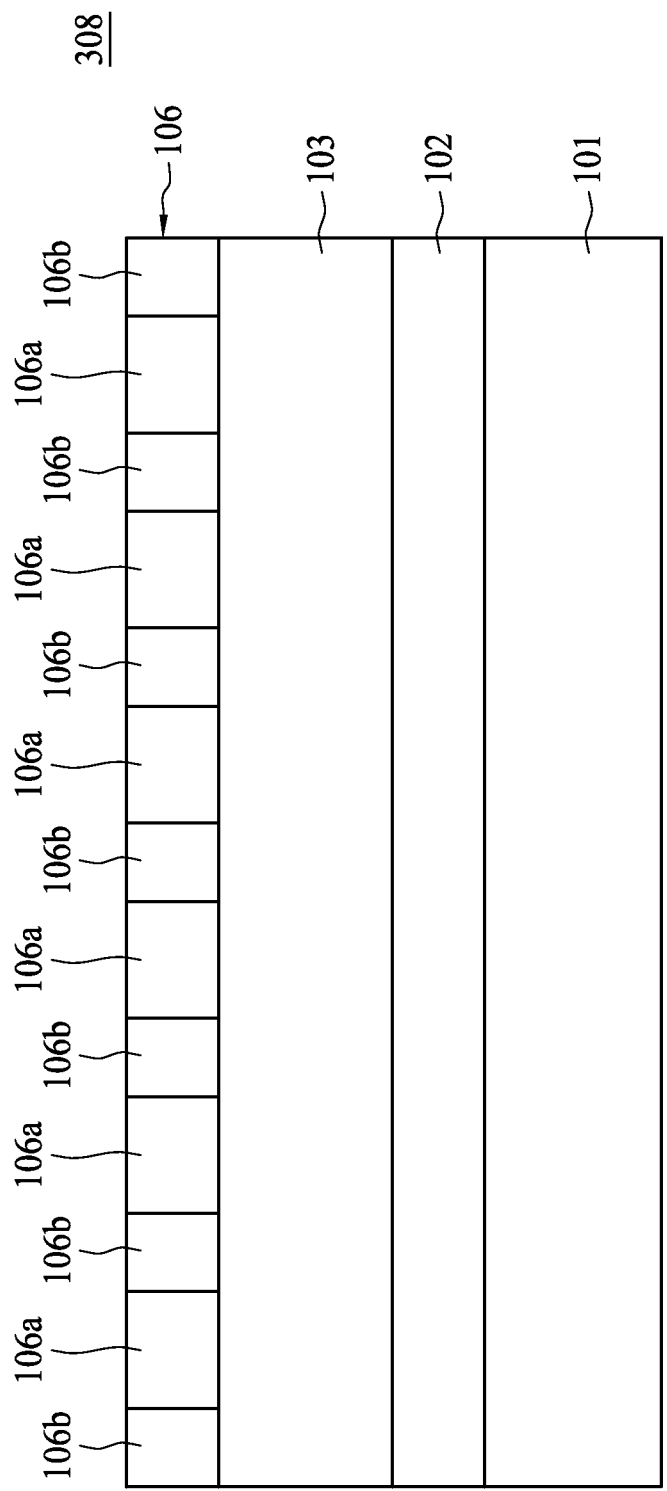
FIG. 4H is a schematic view of removal of a photomask in accordance with some embodiments of the present disclosure.

In operation 308, the photomask 107 (refers to FIG. 4G) is removed as in FIG. 4H. In some embodiments, the predetermined pattern of the photomask 107 is reproduced to the photoresist 106 after exposing the photoresist 106 to the UV light.

Figure 4I:
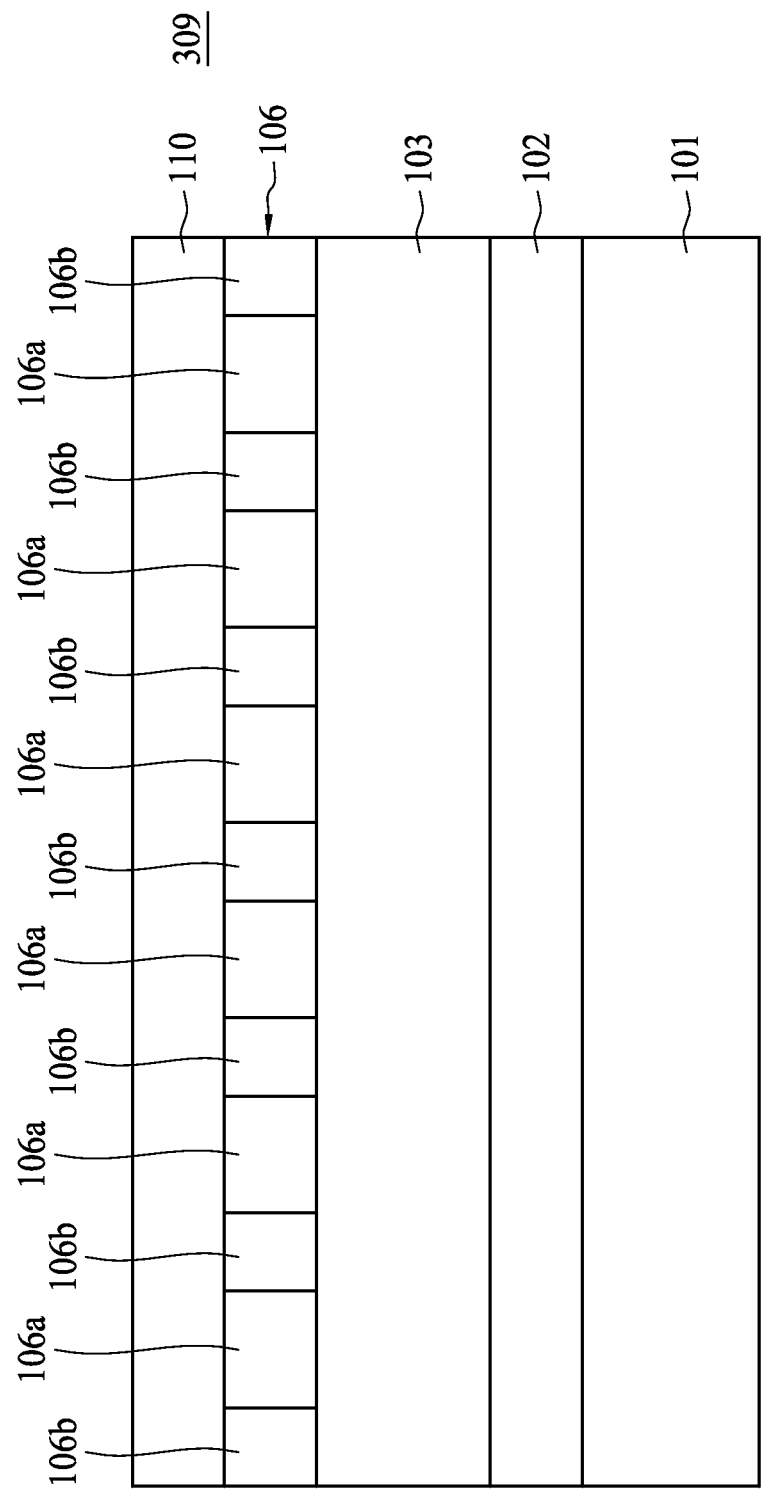
FIG. 4I is a schematic view of a developer solution sprayed on a photoresist in accordance with some embodiments of the present disclosure.

In operation 309, a developer solution 110 is sprayed on the photoresist 106 as in FIG. 4I. In some embodiments, the developer solution 110 selectively dissolves the photoresist 106 in accordance with the predetermined pattern. Thus, some of the photoresist 106 are dissolved by the developer solution 110, while some of the photoresist 106 are remained on the silicon layer 103. The silicon layer 103 is then partially covered by the photoresist 106 in the predetermined pattern.

Figure 4J:
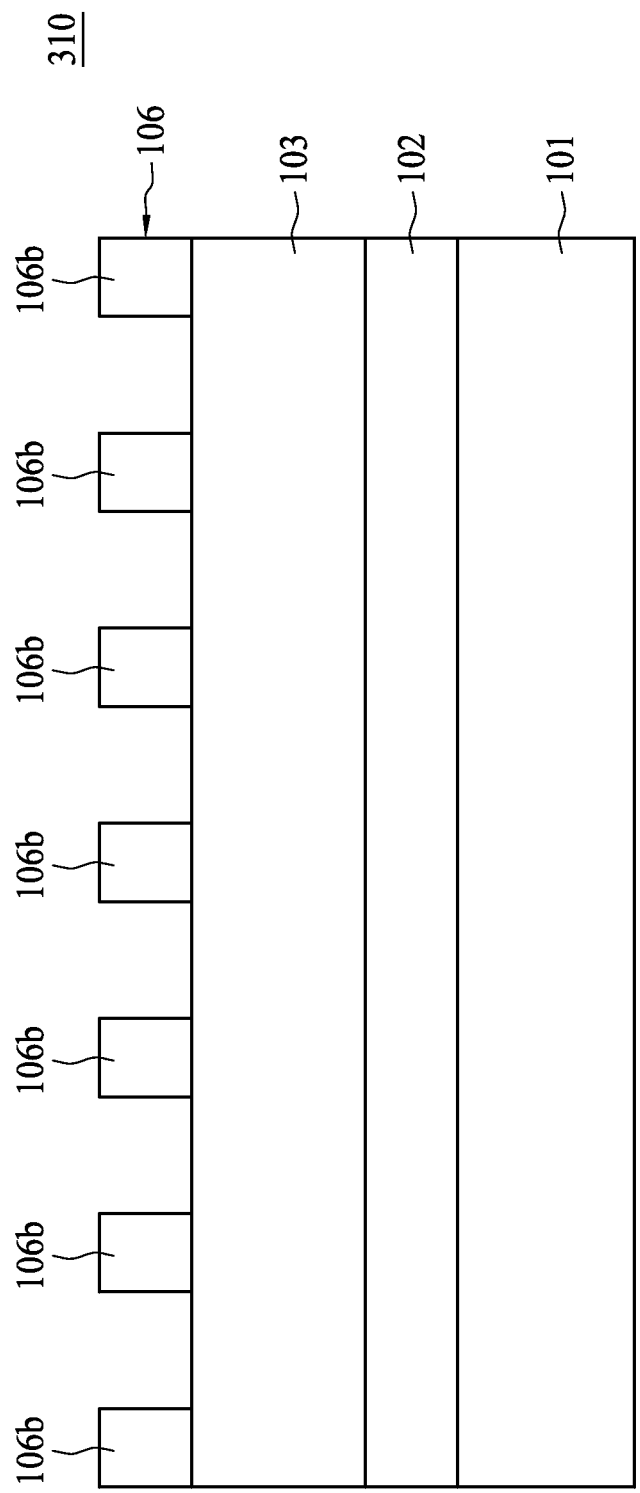
FIG. 4J is a schematic view of a positive photoresist in a predetermined pattern in accordance with some embodiments of the present disclosure.
Figure 4K:
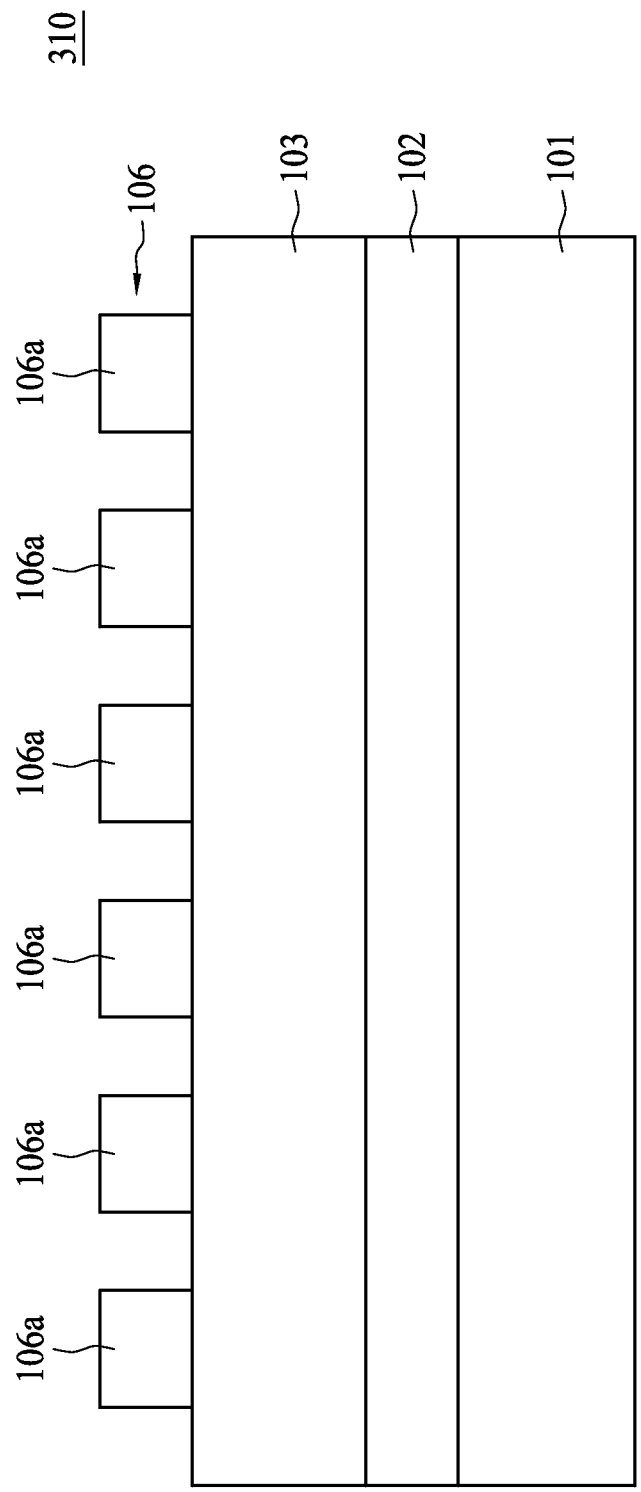
FIG. 4K is a schematic view of a negative photoresist in a predetermined pattern in accordance with some embodiments of the present disclosure.

In operation 310, the photoresist 106 with the predetermined pattern is developed on the silicon layer 103 as in FIG. 4J or 4K.

In some embodiments, if the photoresist 106 is the positive photoresist, the developer solution 110 such as sodium hydroxide or nonionic base solutions dissolves the exposed portions 106a (refers to FIG. 4I), while the unexposed portions 106b are remained on the silicon layer 103 as in FIG. 4J. In some embodiments, if the photoresist 106 is the negative photoresist, the developer solution 110 such as xylene or any other suitable organic solutions dissolves the unexposed portions 106b (refers to FIG. 4I), while the exposed portions 106a are remained on the silicon layer 103 as in FIG. 4K. In some embodiments, the developer solution 110 (refers to FIG. 4I) and the portions of the photoresist 106 dissolved by the developer solution 110 are removed after developing the predetermined pattern of the photoresist 106.

Figure 4L:
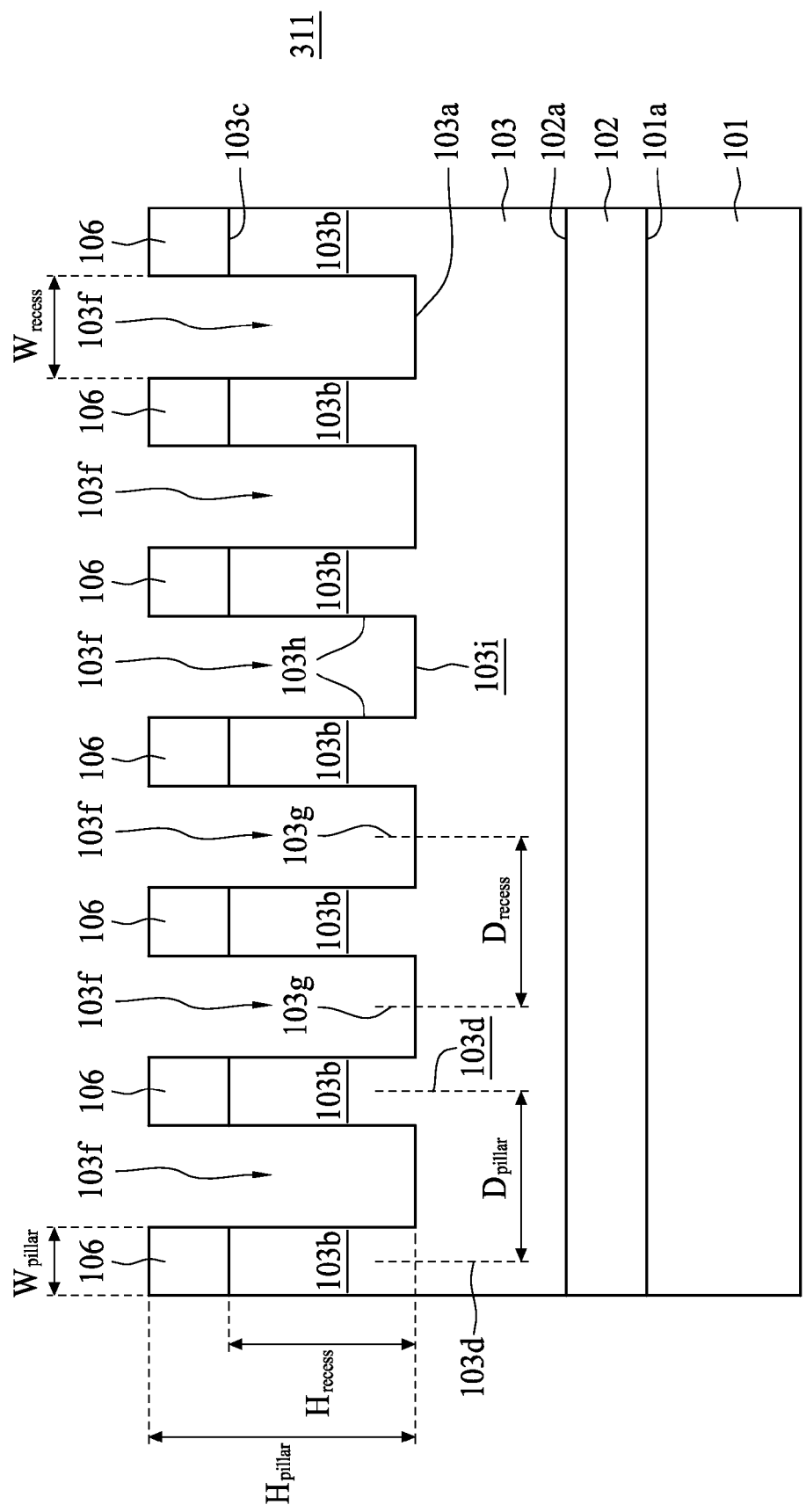
FIG. 4L is a schematic view of several pillars formed corresponding to a predetermined pattern of a photoresist in accordance with some embodiments of the present disclosure.

In operation 311, some portions of silicon layer 103 are removed to form several recesses 103f on a second surface 103a as in FIG. 4L. In some embodiments, some portions of silicon layer 103 without coverage of the photoresist 106 are etched away by a suitable etching operation such as plasma etching, an anisotropic dry etching, a reactive ion etching (RIE), a dry etching or etc.

In some embodiments, the second surface 103a of the silicon layer 103 is scanned by reactive ions for few hundred times and is bombarded by the reactive ions. As some portions of the silicon layer 103 are covered by the photoresist 106 in the predetermined pattern, those portions of the silicon layer 103 covered by the photoresist 106 cannot be etched by the reactive ions. Only the exposed portions of the silicon layer 103 are etched during the etching operation. As such, several recesses 103f are formed on the second surface 103a of the silicon layer 103 corresponding to the predetermined pattern.

In some embodiments, the recesses 103f in substantially same dimension are formed by the etching operation, because the silicon layer 103 is covered by the photoresist 106 in the predetermined pattern developed upon the photolithography operation, and thus the silicon layer 103 can be selectively etched in the predetermined pattern during the etching operation. In some embodiments, the recesses 103f have substantially same shape and size as each other after the photolithography operation and the etching operation.

In some embodiments, a depth of the recess 103f or a height $H_{recess}$ of a sidewall 103h of the recess 103f is substantially same as a height $H_{recess}$ of a sidewall 103h of another recess 103f. In some embodiments, the depth $H_{recess}$ of the recess 103f is about 0.5 um to about 100 um. In some embodiments, a width $W_{recess}$ of the recess 103f is substantially same as a width $W_{recess}$ of another recess 103f.

In some embodiments, the recesses 103f are spaced from each other in a substantially same distance $D_{recess}$. In some embodiments, the distance $D_{recess}$ is about 250 nm. In some embodiments, the distance $D_{recess}$ is about 50 nm to about 1000 nm.

In some embodiments, the recesses 103f are in substantially same orientation. In some embodiments, a central axis 103g of the recess 103f is substantially orthogonal to the second surface 103a. In some embodiments, the sidewall 103h of the recess 103f is also substantially orthogonal to the second surface 103a. In some embodiments, a bottom surface 103i of the recess 103f is substantially parallel to the second surface 103a.

In some embodiments, several pillars 103b are formed after the etching operation. When the recesses 103f are formed, the pillars 103b are also formed correspondingly. As the recesses 103f formed by the photolithography operation and the etching operation are in substantially same dimension, the pillars 103b also have substantially same dimension as each other. Each of the pillars 103b has substantially same shape and size. In some embodiments, the pillars 103b are formed simultaneously on the silicon layer 103 through the photolithography operation and the etching operation. In some embodiments, a height $H_{pillar}$ of the pillar 103b is substantially same as a height $H_{pillar}$ of another pillar 103b. In some embodiments, a width $W_{pillar}$ of the pillar 103b is substantially same as a width $W_{pillar}$ of another pillar 103b.

In some embodiments, the pillars 103b are spaced from each other in a substantially same distance $D_{pillar}$. In some embodiments, the distance $D_{pillar}$ is a distance between central axes 103d of two adjacent pillars 103b. In some embodiments, the distance $D_{pillar}$ is about 250 nm. In some embodiments, the distance $D_{pillar}$ is about 50 nm to about 1000 nm.

Figure 4M:
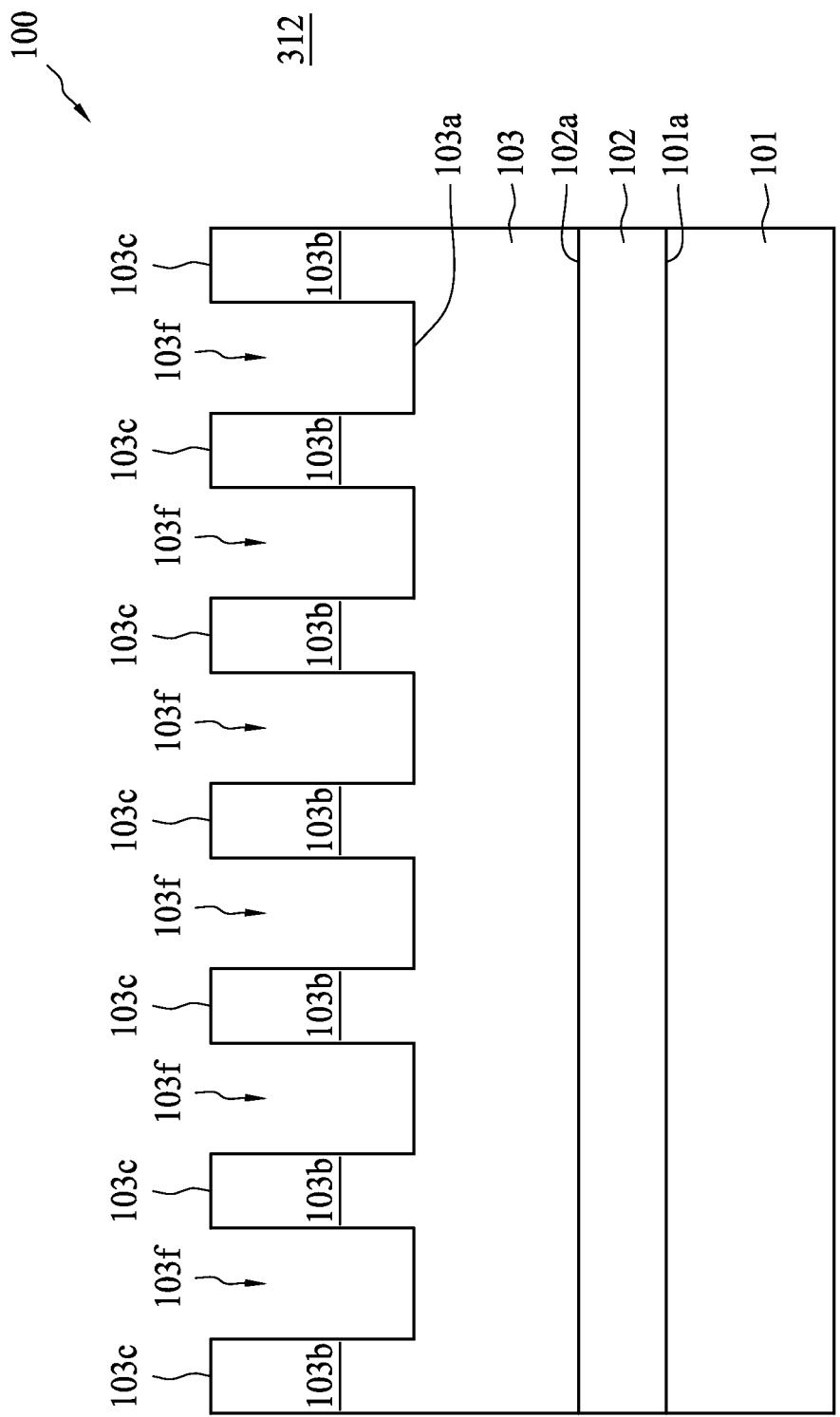
FIG. 4M is a schematic view of a semiconductor device without a photoresist in accordance with some embodiments of the present disclosure.

In operation 312, the photoresist 106 (refers to FIG. 4L) is removed as in FIG. 4M. The photoresist 106 is removed from the silicon layer 103 after the recesses 103f are formed. In some embodiments, the photoresist 106 remained on a top surface 103c of the silicon layer 103 is removed by suitable photoresist stripping techniques, such as chemical solvent cleaning, plasma ashing, dry stripping and/or the like.

In some embodiments, the silicon layer 103 with the recesses 103f becomes a high absorption silicon after the formation of the recesses 103f or pillars 103b and the removal of the photoresist 106 from the silicon layer 103. The high absorption silicon absorbs an electromagnetic radiation of a predetermined wavelength. In some embodiments, a semiconductor device 100 in FIG. 4M is in a similar configuration as the semiconductor device 100 of FIG. 1.

Figure 4N:
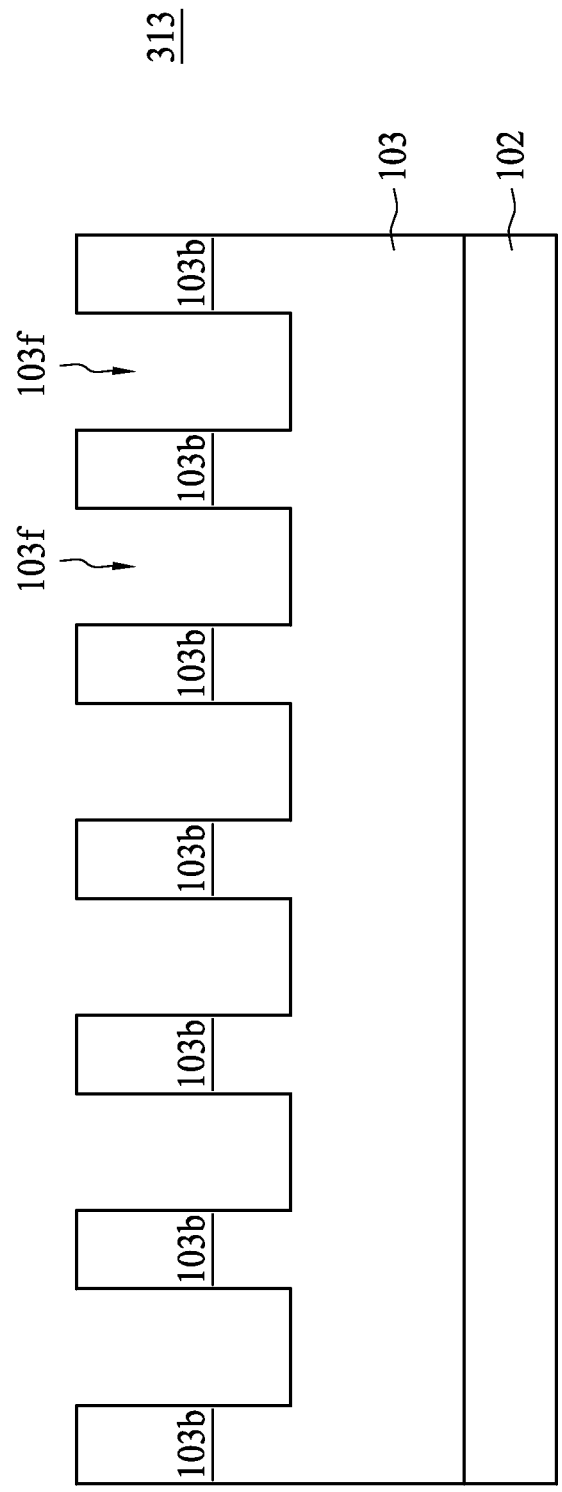
FIG. 4N is a schematic view of a semiconductor device without a first substrate in accordance with some embodiments of the present disclosure.

In operation 313, the first substrate 101 of the semiconductor device 100 (refers to FIG. 4M) is removed as in FIG. 4N. In some embodiments, the first substrate 101 is removed during a backside thinning operation or other suitable grinding operations. A backside of the first substrate 101 opposite to the top surface 101a is ground until the epitaxial layer 102 is exposed. In some embodiments, a portion of the epitaxial layer 102 is remained.

Figure 4P:
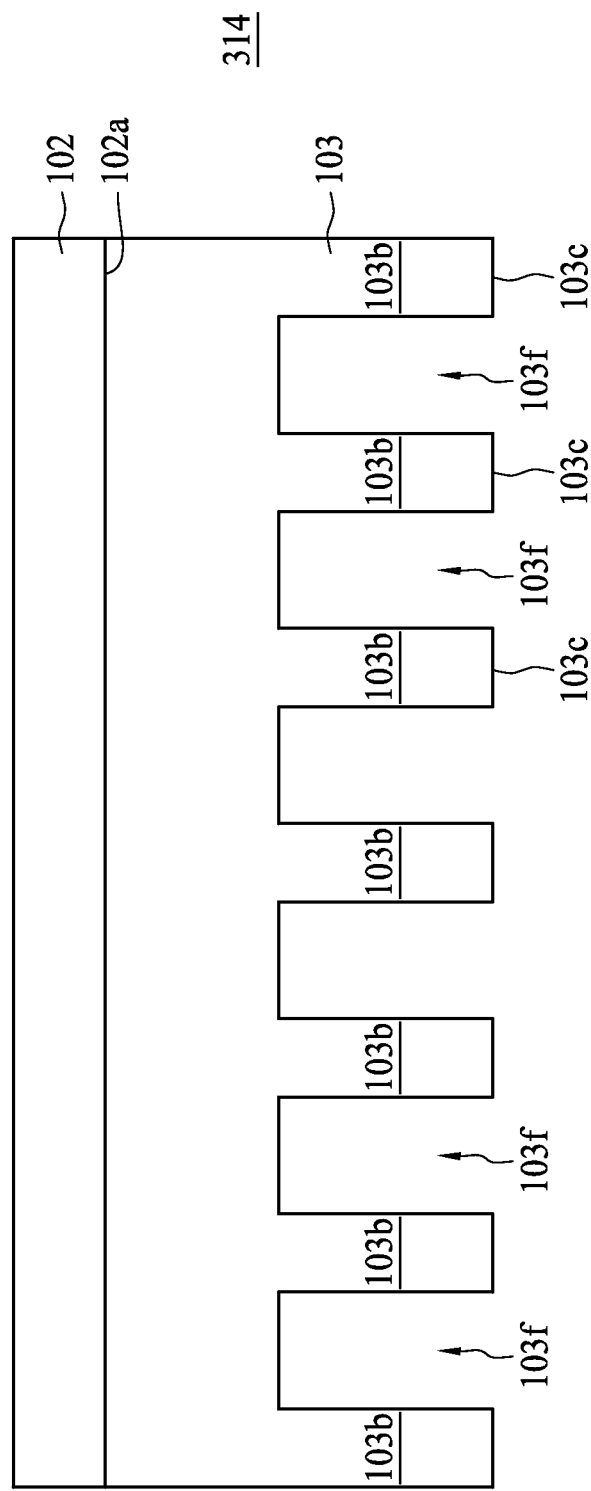
FIG. 4P is a schematic view of a flipped silicon layer and epitaxial layer in accordance with some embodiments of the present disclosure.

In operation 314, the epitaxial layer 102 and the silicon layer 103 with the pillars 103b or the recesses 103f are flipped over as in FIG. 4P. In some embodiments, the epitaxial layer 102 and the silicon layer 103 are flipped upside down so that the pillars 103b or the recesses 103f are facing downward. The top surfaces 103c of the pillars 103b are facing downward. In some embodiments, the epitaxial layer 102 and the silicon layer 103 are flipped by any suitable toolings such as clamp, gripper or etc.

Figure 4Q:
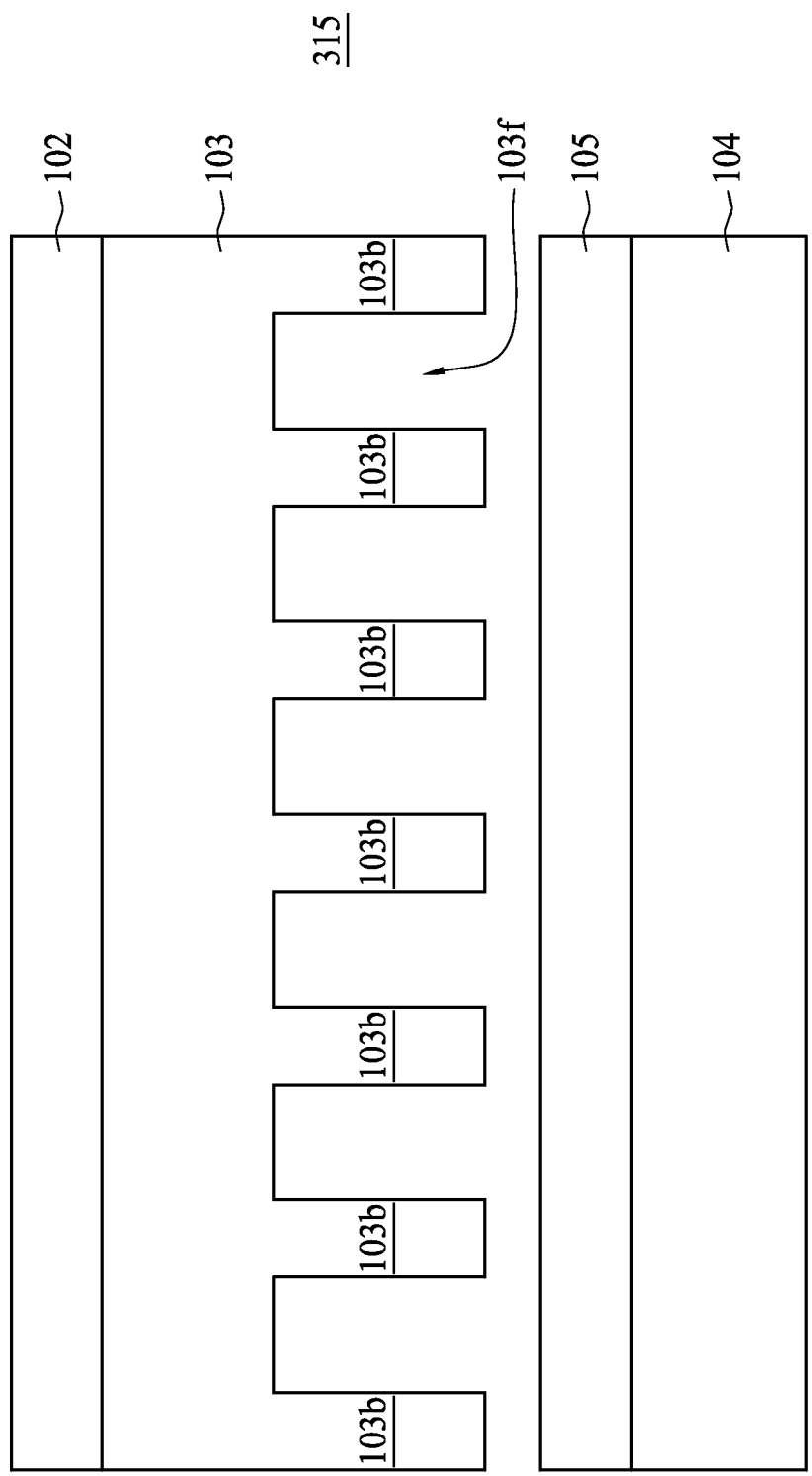
FIG. 4Q is a schematic view of a second substrate and an oxide layer disposed under a flipped high absorption silicon layer and epitaxial layer in accordance with some embodiments of the present disclosure.

In operation 315, a second substrate 104 is provided as in FIG. 4Q. In some embodiments, the second substrate 104 has similar configuration as the second substrate 104 in FIG. 3. In some embodiments, the second substrate 104 includes a circuitry configured for converting the electromagnetic radiation into an electrical signal. In some embodiments, an oxide layer 105 is disposed on the second substrate 104. In some embodiments, the oxide layer 105 has similar configuration as the oxide layer 105 in FIG. 3.

Figure 4R:
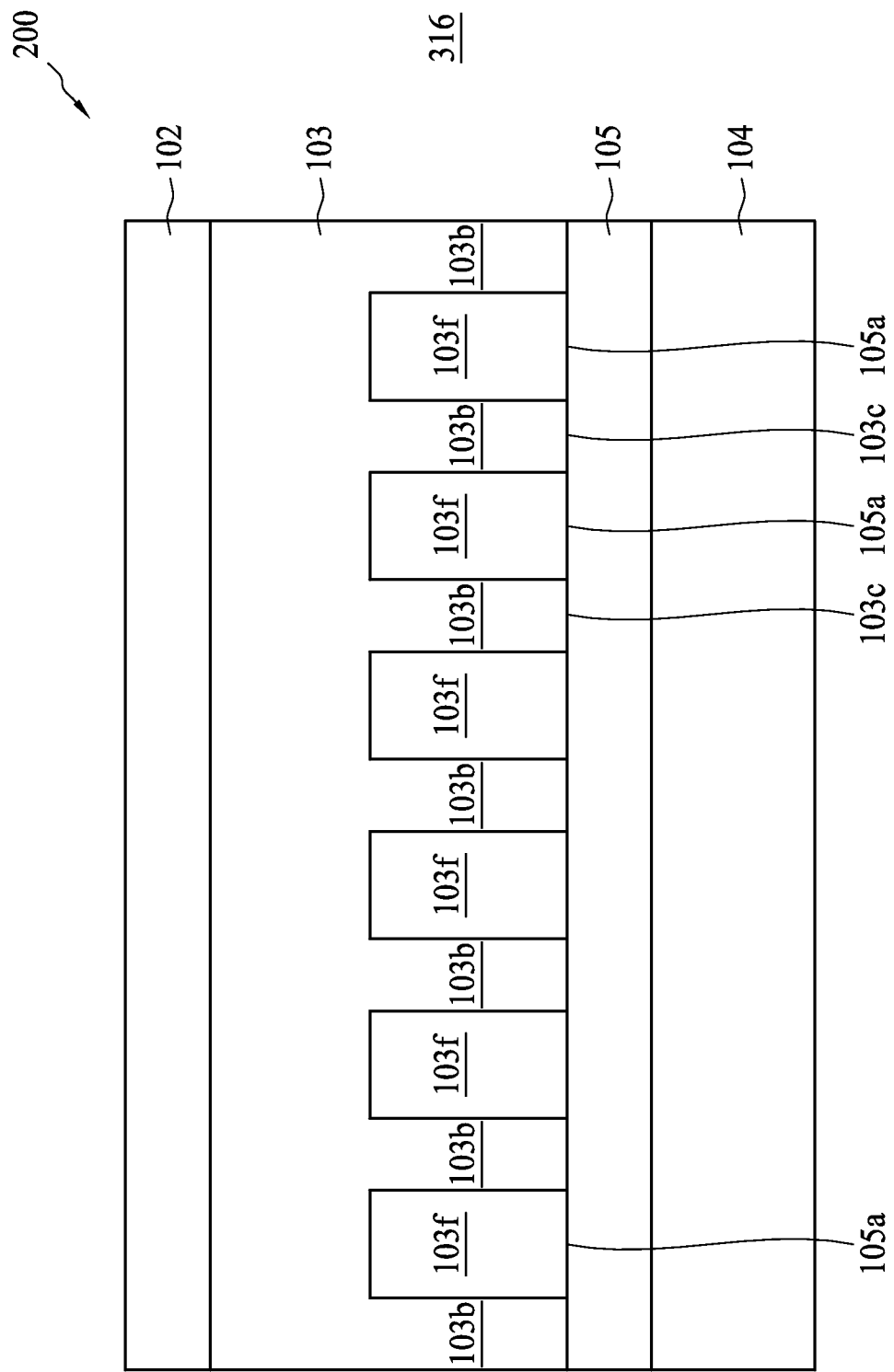
FIG. 4R is a schematic view of a second substrate and an oxide layer bonded with a high absorption silicon layer in accordance with some embodiments of the present disclosure.

In operation 316, the silicon layer 103 is bonded with the oxide layer 105 as in FIG. 4R. In some embodiments, the top surfaces 103c of the pillars 103b are attached with the top surface 105a of the oxide layer 105. In some embodiments, a semiconductor device 200 in FIG. 4R is in similar configuration as the semiconductor device 200 of FIG. 3.

In some embodiments, the electromagnetic radiation such as a light or an infrared (IR) is projected on the epitaxial layer 102 and passes through the silicon layer 103 to the second substrate 104. The electromagnetic radiation is then absorbed by the pillars 103b of the silicon layer 103, and then the electrical signal is generated in accordance with an intensity or brightness of the electromagnetic radiation projected on the epitaxial layer 102. The electrical signal is transmitted to the second substrate 104 for subsequent operations.

Figure 4S:
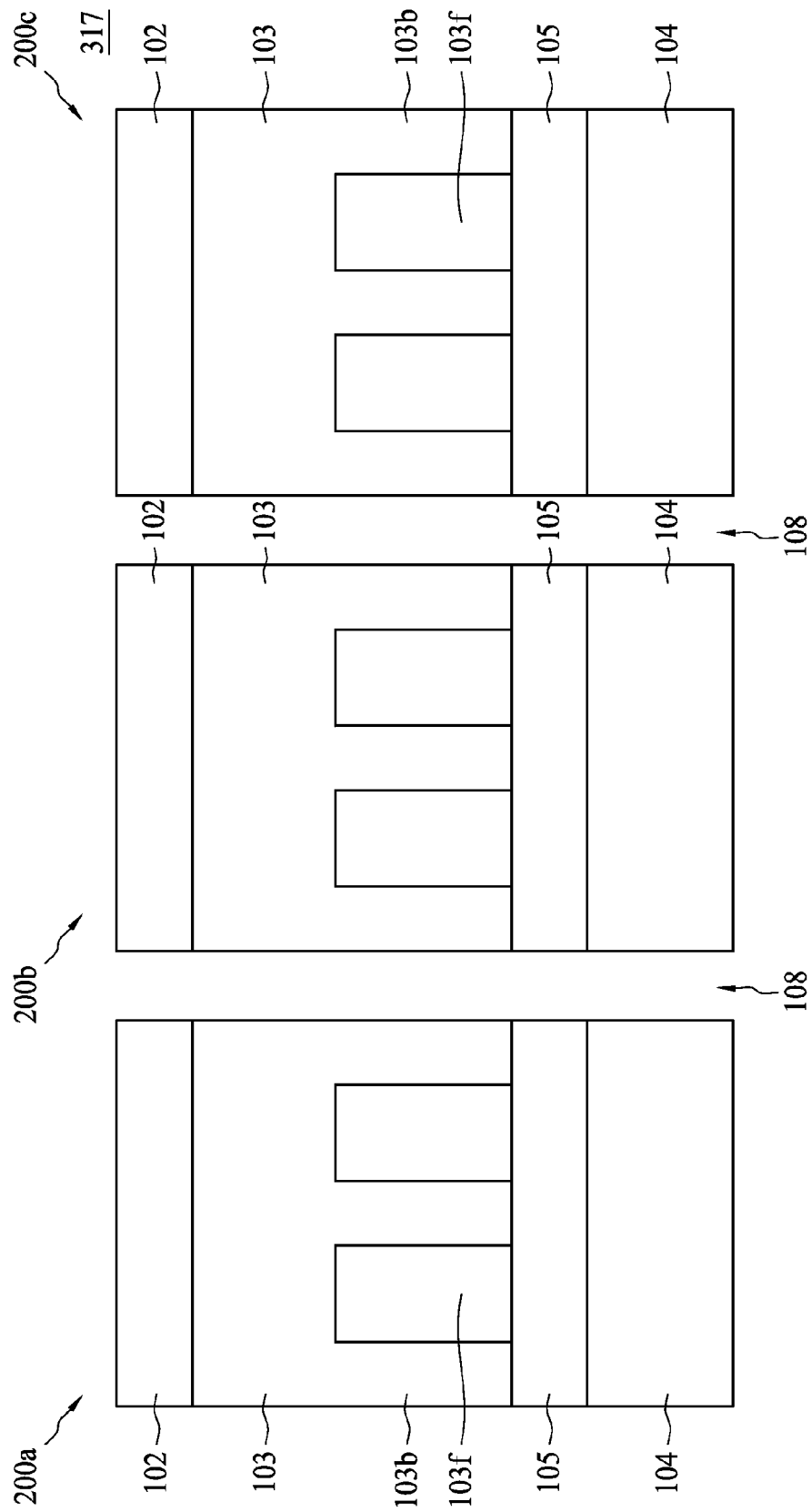
FIG. 4S is a schematic view of singulated semiconductor devices in accordance with some embodiments of the present disclosure.

In operation 317, the semiconductor device 200 is singulated as in FIG. 4S. In some embodiments, the semiconductor device 200 is singulated into several semiconductor devices (200a, 200b and 200c). In some embodiments, the semiconductor device 200 is sawed and individualized into several semiconductor devices (200a, 200b and 200c) by a mechanical or laser blade. In some embodiments, the semiconductor device 200 is singulated in accordance with several scribe lines 108.

In some embodiments, a semiconductor device includes an epitaxial layer including a first surface and a silicon layer disposed on the first surface and including a second surface opposite to the first surface, wherein the silicon layer includes a plurality of pillars on the second surface, a portion of the plurality of pillars on a predetermined portion of the second surface are in substantially same dimension, each of the plurality of pillars on the predetermined portion of the second surface stands substantially orthogonal to the second surface, the plurality of pillars are configured for absorbing an electromagnetic radiation of a predetermined wavelength projected from the epitaxial layer and generating an electrical energy in response to the absorption of the electromagnetic radiation.

In some embodiments, the predetermined wavelength is about 200 nm to about 3000 nm. In some embodiments, the electromagnetic radiation is an infrared (IR) or visible light. In some embodiments, each of the plurality of pillars is in a high aspect ratio between a width and a height of about 1:1 to about 1:100. In some embodiments, the plurality of pillars are in a high density and are consistently spaced from each other in about 50 nm to about 1000 nm. In some embodiments, each of the plurality of pillars has a height of about 0.5 um to about 100 um.

In some embodiments, each of the plurality of pillars is in a needle shape and has a width of a first end smaller than a width of a second end interfacing with the second surface. In some embodiments, each of the plurality of pillars has a first end in a width of about 10 nm to 150 nm and a second end in a width of about 50 nm to about 1000 nm.

In some embodiments, a method of manufacturing a semiconductor device includes providing an epitaxial layer, disposing a silicon layer on a first surface of the epitaxial layer, and forming a plurality of recesses on the silicon layer opposite to the first surface by photolithography operations and etching operations.

In some embodiments, the forming the plurality of recesses on the silicon layer includes disposing a photoresist on the silicon layer. In some embodiments, the forming the plurality of recesses on the silicon layer includes disposing a photomask with a predetermined pattern above a photoresist on the silicon layer. In some embodiments, the forming the plurality of recesses on the silicon layer includes removing some portions of a photoresist on the silicon layer by a light, thereby exposing some portions of the silicon layer opposite to the first surface.

In some embodiments, the forming the plurality of recesses on the silicon layer includes removing some portions of the silicon layer opposite to the first surface by anisotropic dry etching operations. In some embodiments, the forming the plurality of recesses on the silicon layer includes developing a photoresist with a predetermined pattern corresponding to positions of the plurality of recesses on the silicon layer. In some embodiments, the method further includes removing a photoresist from the silicon layer after the plurality of recesses are formed. In some embodiments, the plurality of recesses includes a depth of about 0.5 um to about 100 um.

In some embodiments, a method of manufacturing a semiconductor device includes disposing an epitaxial silicon layer on a first surface of a first substrate, disposing a silicon layer on a second surface of the epitaxial layer opposite to the first surface of the substrate, and modifying the silicon layer to become a high absorption silicon by photolithography operations and etching operations.

In some embodiments, the modifying the silicon layer includes forming a plurality of pillars simultaneously on the silicon layer opposite to the second surface by etching some portions of the silicon layer disposed opposite to the second surface in accordance with a predetermined pattern defined upon the photolithography operations. In some embodiments, the method further comprising removing the first substrate from a surface of the first substrate opposite to the first surface by grinding operations. In some embodiments, the method further comprising flipping over the epitaxial layer and the silicon layer and disposing the silicon layer over a second substrate configured for converting an electromagnetic radiation into an electrical signal.

The methods and features of this disclosure have been sufficiently described in the above examples and descriptions. It should be understood that any modifications or changes without departing from the spirit of the disclosure are intended to be covered in the protection scope of the disclosure.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the disclosure.

What is claimed is:

1. A semiconductor device, comprising:
    an epitaxial layer including a first surface and a doped region over the first surface;
    a silicon layer disposed on the first surface and including a second surface opposite to the first surface, a plurality of pillars disposed over and protruded from the second surface and a plurality of recesses disposed between the plurality of pillars;
    an oxide layer disposed over the plurality of pillars and the plurality of recesses; and
    a substrate disposed over the oxide layer,
    wherein the plurality of pillars are configured for absorbing an electromagnetic radiation of a predetermined wavelength projected from the epitaxial layer and generating an electrical energy in response to the absorption of the electromagnetic radiation, and each of the plurality of pillars is tapered from a first end interfacing with the second surface to a second end interfacing with the oxide layer, and a first width of the first end is substantially greater than a second width of the second end, and the first width and the second width are substantially smaller than a height of each of the plurality of pillars, and each of the plurality of recesses is enclosed by the oxide layer and at least two of the plurality of pillars.

2. The semiconductor device of claim 1, wherein the predetermined wavelength is about 200 nm to about 3000 nm.

3. The semiconductor device of claim 1, wherein the electromagnetic radiation is an infrared (IR) or visible light.

4. The semiconductor device of claim 1, wherein the first width is about 10 nm to about 100 nm.

5. The semiconductor device of claim 1, wherein the plurality of pillars are arranged with a density, and are consistently spaced from each other at a distance of about 50 nm to about 1000 nm.

6. The semiconductor device of claim 1, wherein each of the plurality of pillars has the height of about 0.5 um to about 100 um.

7. The semiconductor device of claim 1, wherein each of the plurality of pillars has a needle shape.

8. The semiconductor device of claim 1, wherein the second width is about 10 nm to 150 nm, and the first width is about 50 nm to about 1000 nm.

9. A method of manufacturing a semiconductor device, comprising:
providing an epitaxial layer including a first surface;
disposing a silicon layer on the first surface;
forming a plurality of recesses over a second surface of the silicon layer opposite to the first surface by photolithography operations and etching operations;
disposing an oxide layer over the plurality of recesses;
disposing a substrate over the oxide layer,
wherein each of the plurality of recesses is enclosed by the oxide layer and at least two of a plurality of pillars protruded from the silicon layer, each of the plurality of recesses is tapered from a first end proximal to the second surface to a second end proximal to the epitaxial layer, and a width of the first end is substantially greater than a width of the second end, and the width of the first end and the width of the second end are substantially smaller than a depth of each of the plurality of recesses.

10. The method of claim 9, wherein the forming the plurality of recesses on the silicon layer includes disposing a photoresist on the silicon layer.

11. The method of claim 9, wherein the forming the plurality of recesses on the silicon layer includes disposing a photomask with a predetermined pattern above a photoresist on the silicon layer.

12. The method of claim 9, wherein the forming the plurality of recesses on the silicon layer includes removing some portions of a photoresist on the silicon layer by a light, thereby exposing some portions of the silicon layer opposite to the first surface.

13. The method of claim 9, wherein the forming the plurality of recesses on the silicon layer includes removing some portions of the silicon layer opposite to the first surface by anisotropic dry etching operations.

14. The method of claim 9, wherein the forming the plurality of recesses on the silicon layer includes developing a photoresist with a predetermined pattern corresponding to positions of the plurality of recesses on the silicon layer.

15. The method of claim 9, further comprising removing a photoresist from the silicon layer after the plurality of recesses are formed.

16. The method of claim 9, wherein the depth is about 0.5 um to about 100 um or the width of the bottom sidewall is about 10 nm to about 100 nm.

17. A method of manufacturing a semiconductor device, comprising:
providing an epitaxial layer;
disposing a silicon layer on the epitaxial layer; and
forming a plurality of pillars over the silicon layer by photolithography operations and etching operations;
disposing an oxide layer over the plurality of pillars; and
disposing a substrate over the oxide layer,
wherein each of the plurality of pillars is tapered from a first end proximal to the epitaxial layer to a second end interfacing with the oxide layer, and a first width of the first end is substantially greater than a second width of the second end, and the first width and the second width are substantially smaller than a height of each of the plurality of pillars, and a plurality of recesses are disposed between the plurality of pillars, and each of the plurality of recesses is enclosed by the oxide layer and at least two of the plurality of pillars.

18. The method of claim 17, wherein the forming the plurality of pillars includes-etching some portions of the silicon layer in accordance with a predetermined pattern defined upon the photolithography operations.

19. The method of claim 17, further comprising grinding the substrate towards the plurality of pillars.

20. The method of claim 17, further comprising flipping over the epitaxial layer and the silicon layer prior to the disposing the oxide layer or the disposing the substrate.

\* \* \* \* \*